(12) United States Patent
Kawanishi et al.

(10) Patent No.: US 8,279,906 B2
(45) Date of Patent: Oct. 2, 2012

(54) LASER DIODE AND METHOD OF MANUFACTURING THE SAME

(75) Inventors: Hidekazu Kawanishi, Miyagi (JP); Junji Sawahata, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/769,834

(22) Filed: Apr. 29, 2010

(65) Prior Publication Data
US 2010/0290493 A1  Nov. 18, 2010

(30) Foreign Application Priority Data
May 15, 2009 (JP) ................................. 2009-118900

(51) Int. Cl.
*H01S 5/00* (2006.01)
(52) U.S. Cl. ............. 372/46.014; 372/43.01; 372/45.01; 372/46.01
(58) Field of Classification Search ............... 372/43.01, 372/46.01, 46.014, 45.01
See application file for complete search history.

(56) References Cited

U.S. PATENT DOCUMENTS

| | | | | |
|---|---|---|---|---|
| 5,683,937 A | * | 11/1997 | Furukawa et al. | 438/42 |
| 5,737,351 A | * | 4/1998 | Ono | 372/46.015 |
| 6,018,539 A | * | 1/2000 | Kimura et al. | 372/45.01 |
| 6,343,087 B2 | * | 1/2002 | Yamamoto | 372/46.01 |
| 6,414,976 B1 | * | 7/2002 | Hirata | 372/45.013 |
| 6,430,203 B1 | * | 8/2002 | Yokouchi et al. | 372/46.013 |
| 6,465,269 B2 | * | 10/2002 | Furushima | 438/31 |
| 6,826,216 B2 | * | 11/2004 | Mitomo et al. | 372/46.01 |
| 2007/0121692 A1 | * | 5/2007 | Kawakami et al. | 372/43.01 |
| 2007/0131960 A1 | * | 6/2007 | Ohmi et al. | 257/103 |

FOREIGN PATENT DOCUMENTS

| | | |
|---|---|---|
| JP | 2002-158402 | 5/2002 |
| WO | WO2007/000614 | * 1/2007 |

* cited by examiner

*Primary Examiner* — Yuanda Zhang
(74) *Attorney, Agent, or Firm* — SNR Denton US LLP

(57) ABSTRACT

A laser diode includes an active layer, a strip-shaped ridge provided above the active layer, a pair of resonator end faces sandwiching the active layer and the ridge from an extending direction of the ridge, and an upland section provided being contacted with both side faces of the ridge in at least one of the resonator end faces of the pair of resonator end face and in the vicinity thereof. A thickness from the active layer to a surface of the upland section is larger on the resonator end face side and is smaller on a central side of the ridge, and the thickness is continuously changed from a thick portion on the resonator end face side to a thin portion on the central side of the ridge.

3 Claims, 20 Drawing Sheets

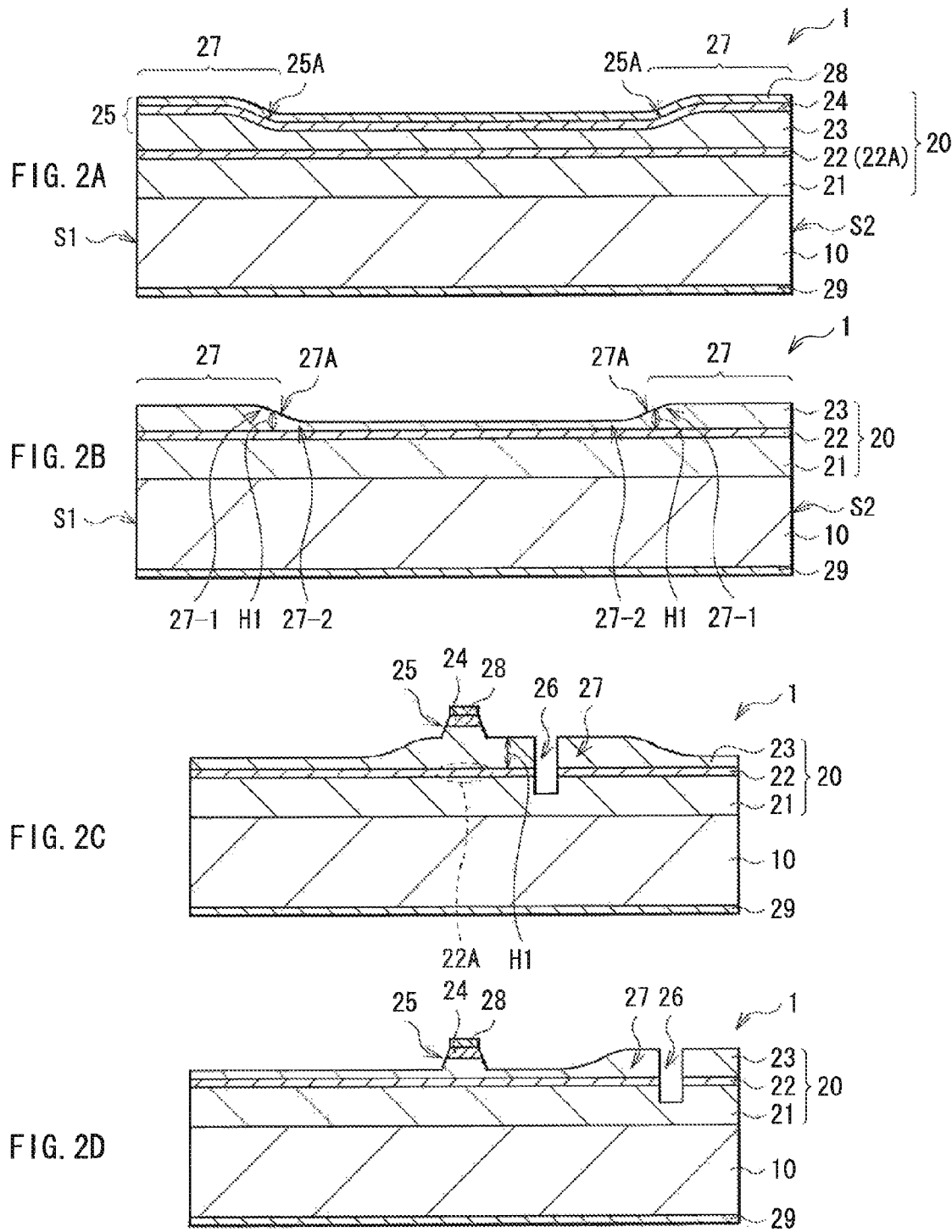

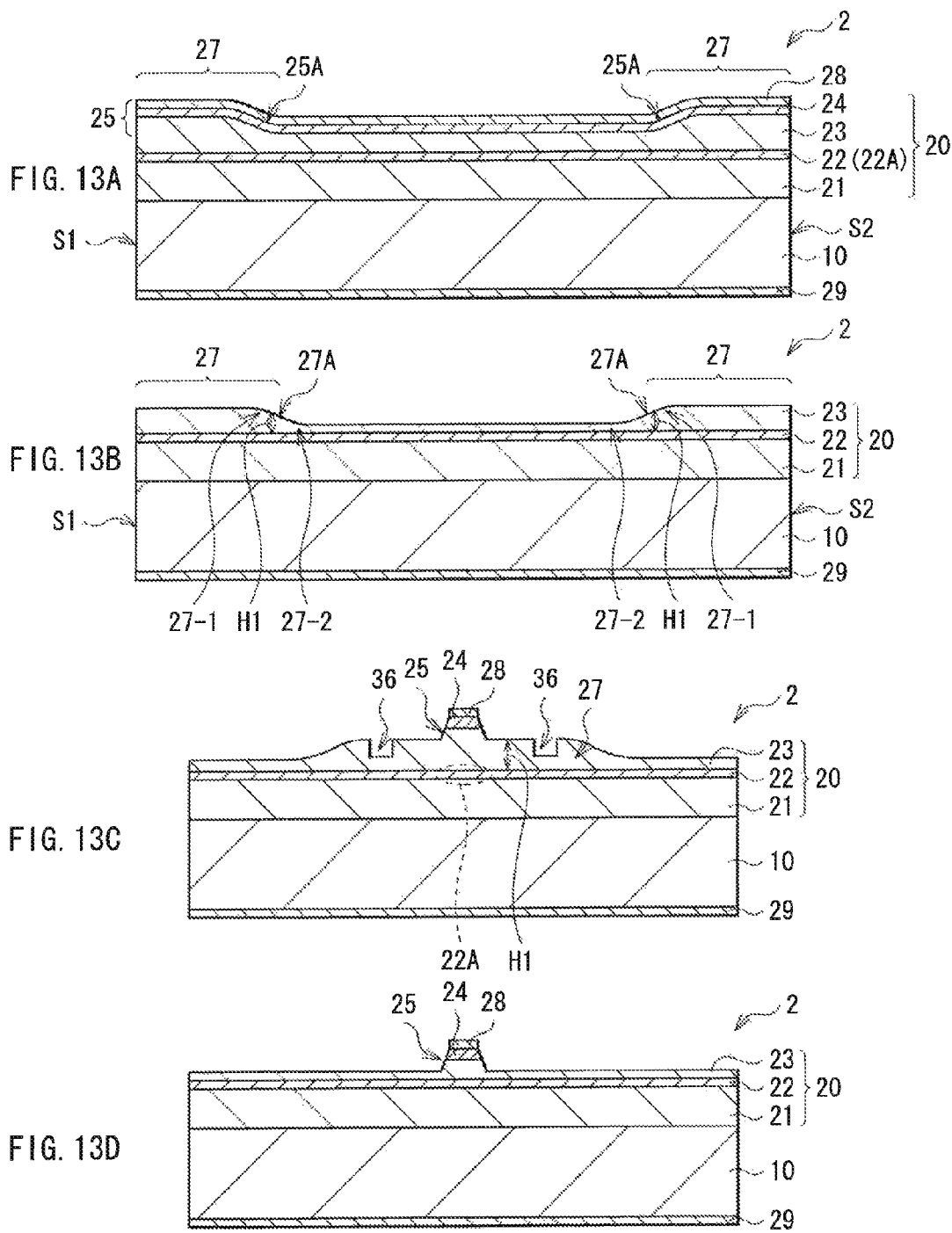

LASER DIODE AND METHOD OF MANUFACTURING THE SAME

BACKGROUND OF THE INVENTION

1. Field of the Invention

The present invention relates to a laser diode particularly suitable for high output usage and a method of manufacturing the same.

2. Description of the Related Art

In general, in a high output laser diode, it is known that Catastrophic Optical Damage (COD) is easily caused by temperature rise associated with recombination at an end face thereof and increase of light absorption. Such COD disturbs high output operation and high reliability. Thus, in order to prevent the COD from being generated, in the past, various improvements have been made.

For example, examples of such improvements include a method of decreasing the light density in the vicinity of the end face. For example, in Japanese Unexamined Patent Application Publication No. 2002-158402, in a ridge waveguide laser diode, the thickness from an active layer to the surface of a ridge side is larger in the end face and in the vicinity thereof, and smaller in the central portion of the ridge stripe. Thereby, in the vicinity of the end face, the light spot size is magnified and the light density is decreased, and thus the COD level is able to be increased. Further, in the central portion of the ridge stripe, a leak current to the ridge side is able to be decreased, and thus the threshold current is able to be kept low.

SUMMARY OF THE INVENTION

In Japanese Unexamined Patent Application Publication No. 2002-158402, as described above, the thickness from the active layer to the surface of the ridge side is larger in the end face and in the vicinity thereof, and smaller in the central portion of the ridge stripe. That is, in the extending direction of the ridge stripe, a step is generated on the surface of the ridge side. Thus, the refractive index difference in the lateral direction in the upper stand of the step is different from that in the lower stand of the step, resulting in difference in optical mode shape. Thus, there has been a disadvantage that light scattering loss is generated in a section where the optical mode shape is drastically changed (that is, a section where the step is generated).

In view of the foregoing disadvantage, in the invention, it is desirable to provide a laser diode in which the light scattering loss caused by drastically changed optical mode shape is able to be decreased and a method of manufacturing the same.

According to an embodiment of the invention, there is provided a laser diode including an active layer, a strip-shaped ridge provided above the active layer, a pair of resonator end faces sandwiching the active layer and the ridge from an extending direction of the ridge, and an upland section provided being contacted with both side faces of the ridge in at least one of the pair of resonator end face and in the vicinity thereof. A thickness from the active layer to a surface of the upland section is larger on the resonator end face side and is smaller on a central side of the ridge, and the thickness is continuously changed from a thick portion on the resonator end face side to a thin portion on the central side of the ridge.

In the laser diode of the embodiment of the invention, in the light guide including the ridge and the upland section, the lateral direction refractive index distribution in the vicinity of the resonator end face is more moderate than the lateral direction refractive index distribution in the center of the ridge. Further, the lateral direction refractive index distribution of the light guide is continuously changed in the resonator direction. Thereby, compared to a case that a step is generated on the surface of the ridge side, change in the resonator direction of the lateral direction refractive index distribution becomes moderate.

According to an embodiment of the invention, there is provided a first method of manufacturing a laser diode including the following four steps:

(A1) a first step of forming, on a substrate, a first semiconductor layer sequentially including a lower cladding layer and an active layer from the substrate side;

(A2) a second step of providing a groove in a location which is at least one region of both sides of a strip-shaped ridge region to be a place where a ridge is formed, which is apart from the ridge region and which is at least an outer edge of the device region, the location being a device region surrounded by a lattice-shaped cut region that is to be subsequently a place where the substrate is cut in the top face of the first semiconductor layer;

(A3) a third step of forming a second semiconductor layer composed of at least an upper cladding layer on the top face of the first semiconductor layer including the groove; and (A4) a fourth step of forming an insulating layer in a region corresponding to the ridge region in a top face of the second semiconductor layer, and selectively etching the second semiconductor layer by using the insulating layer as a mask.

In the first method of manufacturing a laser diode of the embodiment of the invention, the second semiconductor layer is formed on the top face of the first semiconductor layer including the groove. At this time, in the second semiconductor layer, only a portion around the groove is naturally formed thick, and a slope whose thickness is smoothly and moderately decreased as the slope is apart from the groove is formed. That is, in forming the second semiconductor layer, a discontinuous structure is not formed in both sides of the ridge region. Thus, after that, by selectively etching the second semiconductor layer by using the insulating layer as a mask, the ridge is formed, and the upland section having the continuous and moderate slope is formed on the surface contacted with both side faces of the ridge. Thereby, compared to a case that a step is generated on the surface of the ridge side, change in the resonator direction of the lateral direction refractive index distribution becomes moderate.

According to an embodiment of the invention, there is provided a second method of manufacturing a laser diode including the following four steps:

(B1) a first step of forming, on a substrate, a first semiconductor layer sequentially including a lower cladding layer and an active layer from the substrate side;

(B2) a second step of forming a first insulating layer in a location which is at least one region of both sides of a strip-shaped ridge region to be a place where a ridge is formed, which is apart from the ridge region and which is at least an outer edge of the device region, the location being a device region surrounded by a lattice-shaped cut region that is to be subsequently a place where the substrate is cut in the top face of the first semiconductor layer;

(B3) a third step of forming a second semiconductor layer composed of at least an upper cladding layer on the top face of the first semiconductor layer except a region where the first insulating layer is formed; and (B4) a fourth step of forming a second insulating layer in a region corresponding to the ridge region in a top face of the second semiconductor layer, and selectively etching the second semiconductor layer by using the second insulating layer as a mask.

In the second method of manufacturing a laser diode of the embodiment of the invention, the second semiconductor layer is formed in the region other than the first insulating layer in the top face of the first semiconductor layer. At this time, in the second semiconductor layer, only a portion around the first insulating layer is naturally formed thick, and a slope whose thickness is smoothly and moderately decreased as the slope is apart from the first insulating layer is formed. That is, in forming the second semiconductor layer, a discontinuous structure is not formed in both sides of the ridge region. Thus, after that, by selectively etching the second semiconductor layer by using the second insulating layer as a mask, the ridge is formed, and the upland section having the continuous and moderate slope is formed on the surface contacted with both side faces of the ridge. Thereby, compared to a case that a step is generated on the surface of the ridge side, change in the resonator direction of the lateral direction refractive index distribution becomes moderate.

According to the laser diode and the first and the second methods of manufacturing a laser diode of the embodiments of the invention, compared to a case that a step is generated on the surface of the ridge side, change in the resonator direction of the lateral direction refractive index distribution becomes moderate. Thereby, light scattering loss caused by drastically changed optical mode shape is able to be decreased Other and further objects, features and advantages of the invention will appear more fully from the following description.

BRIEF DESCRIPTION OF THE DRAWINGS

FIGS. 2A to 2D are cross sectional views of the laser diode of FIG. 1.

FIGS. 13A to 13D are cross sectional views of the laser diode of FIG. 12.

DETAILED DESCRIPTION OF THE PREFERRED EMBODIMENTS

Embodiments of the invention will be hereinafter described in detail with reference to the drawings. The description will be given in the following order:
1. First embodiment (example that an upland section is formed by using a groove)
2. Modified example of First embodiment (variation of positions of the groove and the upland section)
3. Second embodiment (example that an upland section is formed by using an insulating layer)
4. Modified example of Second embodiment (variation of positions of the groove and the upland section)

First Embodiment

Configuration of Laser Diode 1

Figure 1:
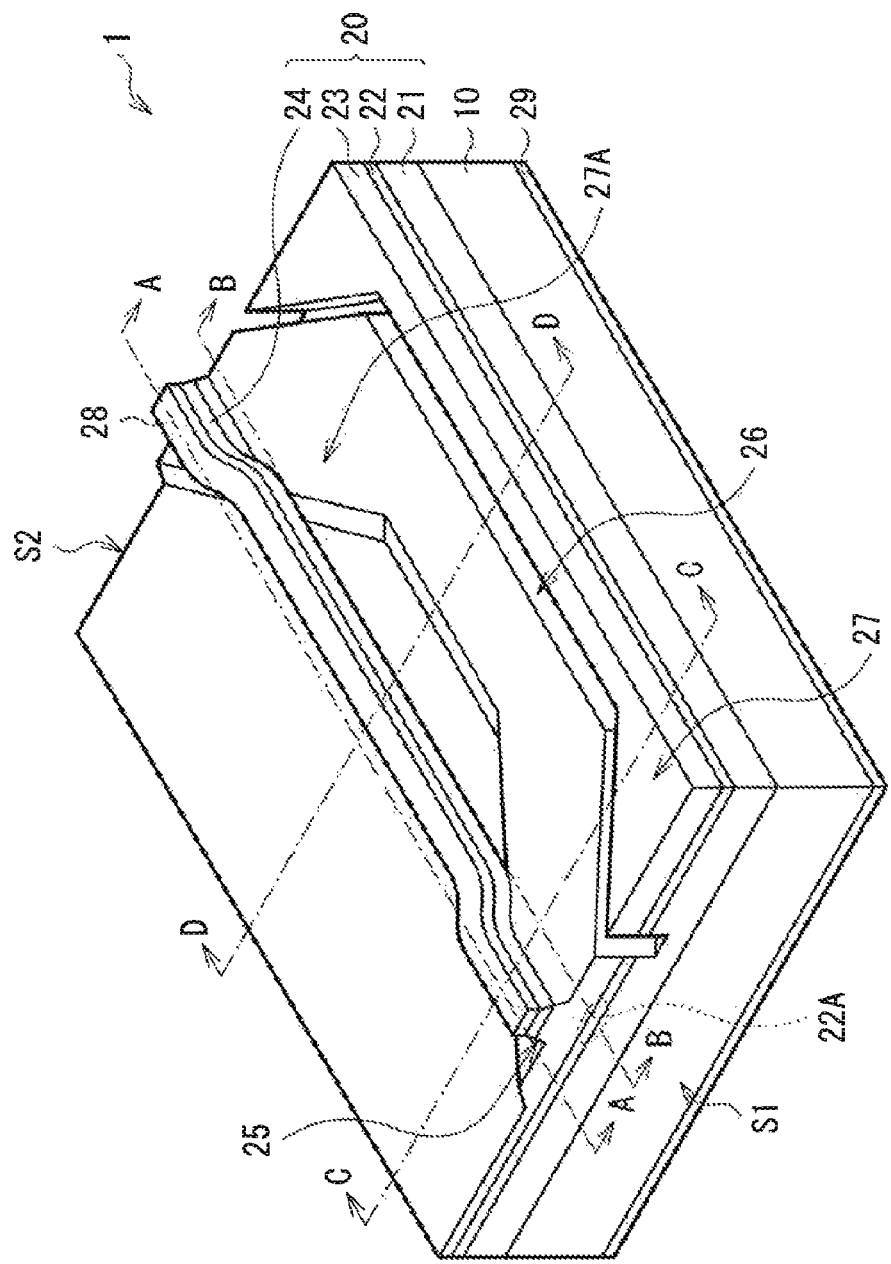
FIG. 1 is a perspective view of a laser diode according to a first embodiment of the invention.

FIG. 1 is a perspective view illustrating a schematic configuration of a laser diode 1 according to a first embodiment of the invention. FIG. 2A illustrates a cross sectional configuration taken along line A-A of the laser diode 1 of FIG. 1, and FIG. 2B illustrates a cross sectional configuration taken along line B-B of the laser diode 1 of FIG. 1, respectively. FIG. 2C illustrates a cross sectional configuration taken along line C-C of the laser diode 1 of FIG. 1, and FIG. 2D illustrates a cross sectional configuration taken along line D-D of the laser diode 1 of FIG. 1, respectively. FIG. 1 and FIGS. 2A to 2D are schematic views and thus the dimensions and the shapes thereof are different from the actual dimensions and the actual shapes.

The laser diode 1 of this embodiment has a configuration in which an after-mentioned semiconductor layer 20 is sandwiched between a pair of resonator end faces (a front end face S1 and a rear end face S2) from the resonator direction (the extending direction of a ridge 25). Thus, the laser diode 1 is a kind of so-called edge emitting laser diode. The laser diode 1 includes, for example, the semiconductor layer 20 including a lower cladding layer 21, an active layer 22, an upper cladding layer 23, and a contact layer 24 in this order from a substrate 10 side over the substrate 10. The semiconductor layer 20 may be further provided with a layer other than the foregoing layers (for example, a buffer layer, a guide layer, an electron barrier layer and the like).

The substrate 10 is composed of, for example, Group III-V nitride semiconductor such as GaN. "Group III-V nitride semiconductor" represents semiconductor containing at least one from Group 3B elements in the short period periodic table and at least N from Group 5B elements in the short period periodic table. Examples of Group III-V nitride semiconductor include a gallium nitride-based compound containing Ga and N. Examples of gallium nitride-based compound include GaN, AlGaN, and AlGaInN. According to needs, the Group III-V nitride semiconductor is doped with n-type impurity of Group IV element or Group VI element such as Si, Ge, O, and Se, or is doped with p-type impurity of Group II element or Group IV element such as Mg, Zn, and C.

The semiconductor layer 20 mainly contains, for example, Group III-V nitride semiconductor. The lower cladding layer 21 is composed of, for example, AlGaN. The active layer 22 has, for example, a multiquantum well structure in which a well layer and a barrier layer that are respectively formed from GaInN having each composition ratio different from each other are alternately layered. The upper cladding layer 23 is composed of, for example, AlGaN. The contact layer 24 is composed of, for example, GaN.

In the upper section of the semiconductor layer 20, specifically, in the upper section of the upper cladding layer 23 and the contact layer 24, a strip-shaped ridge 25 is formed. The ridge 25 is, for example, linear if viewed from the lamination direction of the semiconductor layer 20. The ridge 25 structures a light guide together with both sides of the ridge 25 in the semiconductor layer 20. The ridge 25 confines light in the lateral direction by using a refractive index difference in the lateral direction (direction orthogonal to the resonator direction), and narrows a current injected into the semiconductor layer 20. A section directly under the foregoing light guide in the active layer 22 corresponds to a current injection region. The current injection region is a light emitting region 22A.

In the semiconductor layer 20, the pair of front end face S1 and the rear end face S2 sandwiching the ridge 25 from the extending direction of the ridge 25 is formed. The front end face S1 and the rear end face S2 are formed by cutting, and are, for example, a cleaved face formed by cleavage. A resonator is composed of the front end face S1 and the rear end face S2 in the lamination in-plane direction. The front end face S1 is a face emitting laser light. A multilayer reflective film (not illustrated) is formed on the surface of the front end face S1. Meanwhile, the rear end face S2 is a face reflecting laser light. A multilayer reflective film (not illustrated) is also formed on the surface of the rear end face S2. The multilayer reflective film on the front end face S1 side is a low reflectance film adjusted so that the reflectance of an emitting-side end face composed of the multilayer reflective film and the front end face S1 becomes, for example, about 10%. Meanwhile, the multilayer reflective film on the rear end face S2 side is a high reflectance film adjusted so that the reflectance of a reflection side end face composed of the multilayer reflective film and the rear end face S2 becomes, for example, about 95%.

The ridge 25 and both sides of the ridge 25 (after-mentioned upland section 27) of this embodiment correspond to a specific example of "light guide" of the invention. Further, the pair of the front end face S1 and the rear end face S2 of this embodiment corresponds to a specific example of "a pair of resonator end faces" of the invention.

An upper electrode 28 is provided on the top face of the ridge 25 (surface of the contact layer 24). In the upper electrode 28, for example, Ti, Pt, and Au are layered in this order. The upper electrode 28 is electrically connected to the contact layer 24. Meanwhile, a lower electrode 29 is provided on the rear face of the substrate 10. In the lower electrode 29, for example, an alloy of Au and Ge, Ni, and Au are sequentially layered from the substrate 10 side. The lower electrode 29 is electrically connected to the substrate 10.

Further, in this embodiment, for example, a structure to decrease the light density in the vicinity of both end faces (the front end face S1 and the rear end face S2) is provided in a section of both sides of the ridge 25 (skirts of the ridge 25) in the semiconductor layer 20. Specifically, for example, as illustrated in FIG. 1, a groove 26 and the upland section 27 are provided on the top face of the semiconductor layer 20.

The groove 26 is provided at least on one of both sides of the ridge 25. Further, the groove 26 is provided at least in one end face (the front end face S1 or the rear end face S2) or in the vicinity thereof. The groove 26 may be provided being contacted with at least one end face. For example, as illustrated in FIG. 1, the groove 26 is provided on only one side of both sides of the ridge 25. Further, for example, as illustrated in FIG. 1, the groove 26 is provided (is extended) from the front end face S1 (or in the vicinity of the front end face S1) to the rear end face S2 (or in the vicinity of the rear end face S2). Further, for example, as illustrated in FIG. 1, the groove 26 is provided being contacted with the front end face S1 and the rear end face S2.

The groove 26 is extended in the direction crossing the extending direction of the ridge 25 in the vicinity of the front end face S1 and the rear end face S2. Specifically, the groove 26 is extended in the direction in which a gap between the groove 26 and the ridge 25 becomes smaller as the position of the groove 26 becomes close to the end section of the ridge 25 (end section in the extending direction). In other words, as the groove 26 becomes apart from the end face, the groove 26 becomes apart from the ridge 25 in the vicinity of the front end face S1 and the rear end face S2. Further, the grove section 26 is provided in a region apart from the ridge 25 in a section where the groove 26 is apart from the front end face S1 and the rear end face S2. That is, in this embodiment, the groove 26 is in the shape of an arch projecting toward the opposite side of the ridge 25 in the plane of the top face of the semiconductor layer 20. As illustrated in FIG. 1, FIG. 2C, and FIG. 2D, the groove 26 has a depth from the top face side of the semiconductor layer 20 to the level reaching the lower cladding layer 21, and penetrates through the active layer 22.

The upland section 27 is provided in a region along the groove 26, that is, on both sides of the groove 26. Both end sections of the upland section 27 are provided being contacted with both side faces of both end sections of the ridge 25 in the resonator end faces (the front end face S1 and the rear end face S2) in the proximity of the groove 26 (or being contacted with the groove 26) and in the vicinity thereof. Meanwhile, the section other than both end sections in the upland section 27 is provided apart from the ridge 25, and is not contacted with the ridge 25. That is, in this embodiment, the upland section 27 is in the shape of an arch projecting toward the opposite side of the ridge 25 in the plane of the top face of the semiconductor layer 20 as the groove 26 is.

A thickness H1 from the active layer 22 to the surface contacted with both side faces of the ridge 25 is larger on the front end face S1 side, and is smaller on the central side of the ridge 25 in the front end face S1 and in the vicinity thereof in the upland section 27. Similarly, the thickness H1 from the active layer 22 to the surface contacted with both side faces of the ridge 25 is larger on the rear end face S2 side, and is smaller on the central side of the ridge 25 in the rear end face S2 and in the vicinity thereof in the upland section 27. That is, in the upland section 27, the thickness H1 is larger on the resonator end face side, and the thickness H1 is smaller in the central side of the ridge 25 in the resonator end faces (the front end face S1 and the rear end face S2) in the proximity of the groove 26 (or being contacted with the groove 26) and in the vicinity thereof.

Further, the thickness H1 is continuously changed from a thick section 27-1 on the front end face S1 side to a thin section 27-2 in the central side of the ridge 25 in the vicinity of the front end face S1 in the upland section 27. That is, the upland section 27 has an inclined face 27A that is moderately inclined from the thick section 27-1 on the front end face S1 side to the thin section 27-2 on the central side of the ridge 25, and does not have a step generated by a selective etching or the like. Similarly, the thickness H1 is continuously changed from the thick section 27-1 on the rear end face S2 side to the thin section 27-2 on the central side of the ridge 25 in the vicinity of the rear end face S2 in the upland section 27. That is, the upland section 27 has the inclined face 27A that is moderately inclined from the thick section 27-1 on the rear end face S2 side to the thin section 27-2 on the central side of the ridge 25, and does not have a step generated by a selective etching or the like. Thereby, in the light guide including the ridge 25 and both sides of the ridge 25 (upland section 27), the lateral direction refractive index distribution in the vicinity of both end faces is more moderate than the lateral direction refractive index distribution in the central portion in the resonator direction. The light guide including the ridge 25 and both sides of the ridge 25 will be hereinafter simply referred to as the light guide.

As illustrated in FIG. 1, in the vicinity of the front end face S1 and the rear end face S2, both end sections of the upland section 27 are provided not only on both sides of both end sections of the ridge 25, but also directly under both end sections of the ridge 25. Thus, as illustrated in FIG. 2A, if viewed from the lamination in-plane direction of the semiconductor layer 20, the ridge 25 has swell in the lamination direction in the vicinity of the end section of the ridge 25. "Swell" section in the ridge 25 corresponds to an inclined face 25A that is moderately inclined in the extending direction of the ridge 25, and does not have a step generated by a selective etching or the like. The thickness of the ridge 25 itself does not depend on each region of ridge 25, but is almost constant.

Manufacturing Method of the Laser Diode 1

The laser diode 1 having the foregoing configuration is able to be manufactured, for example, as follows.

Figure 3A:
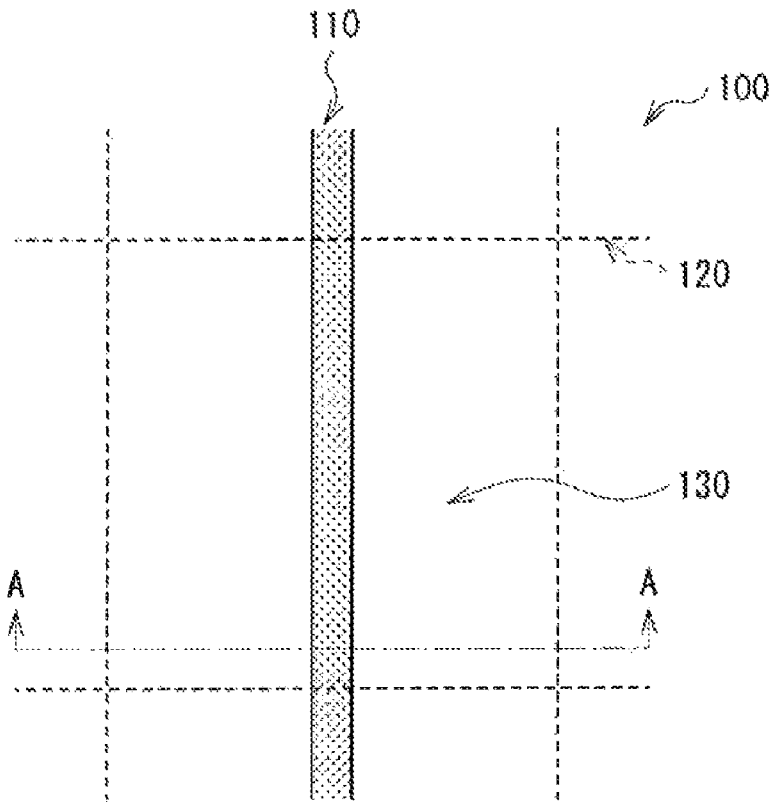
FIGS. 3A and 3B are a top view and a cross sectional view for explaining a method of manufacturing the laser diode of FIG. 1.
Figure 3B:
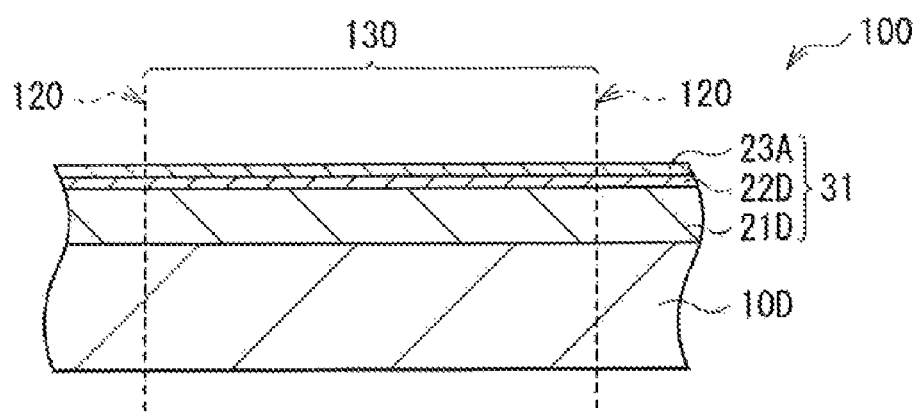
Figure 4A:
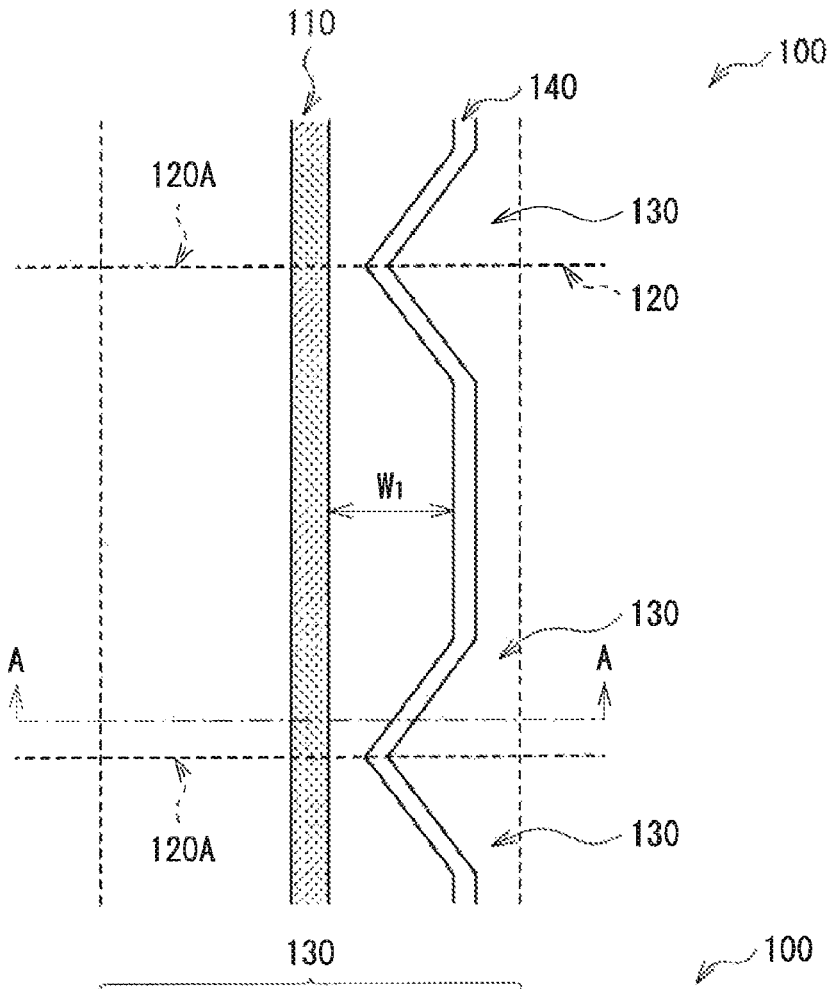
FIGS. 4A and 4B are a top view and a cross sectional view for explaining a step following FIGS. 3A and 3B.
Figure 4B:
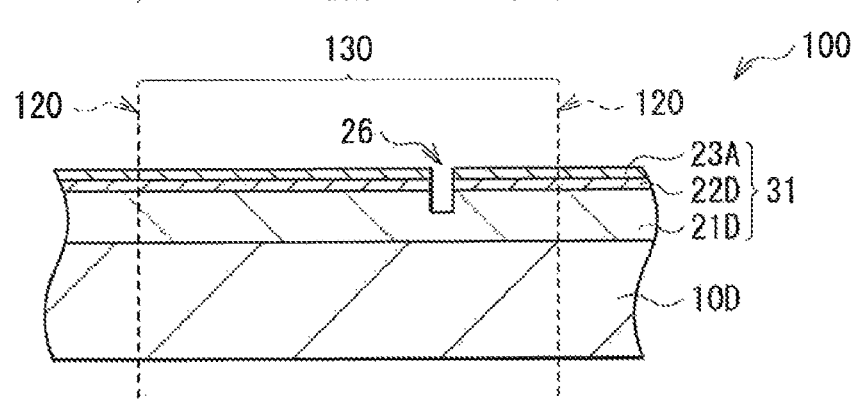
Figure 5A:
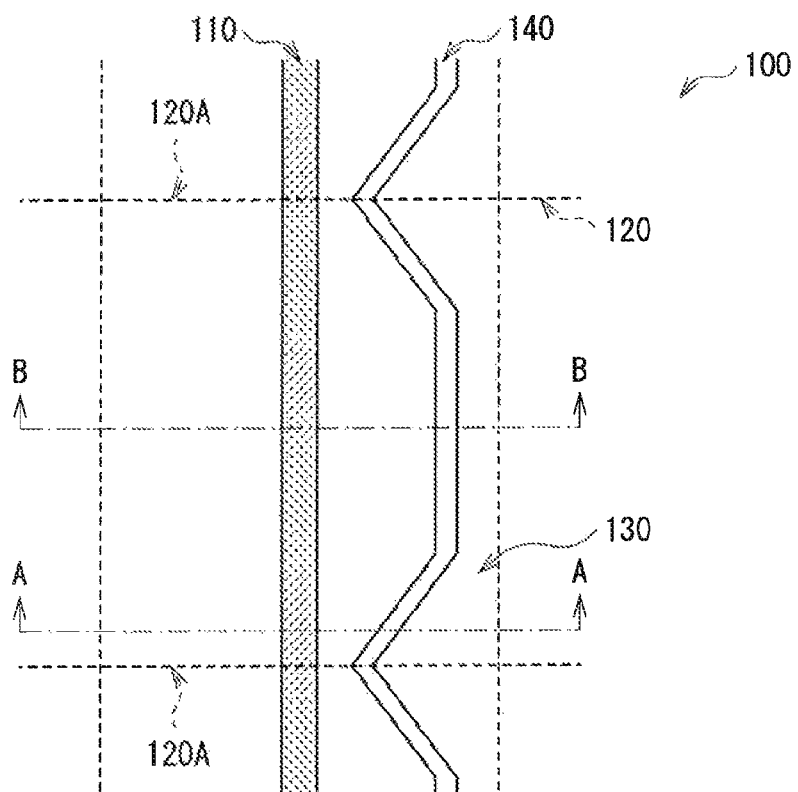
FIGS. 5A to 5C are a top view and cross sectional views for explaining a step following FIGS. 4A and 4B.
Figure 5B:
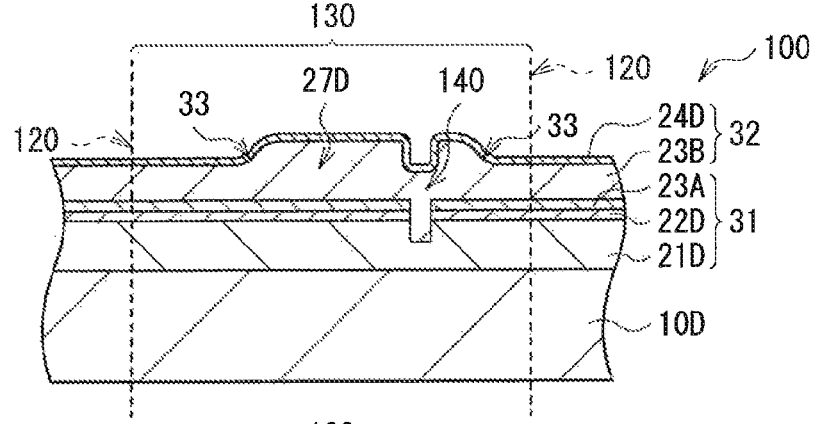
Figure 5C:
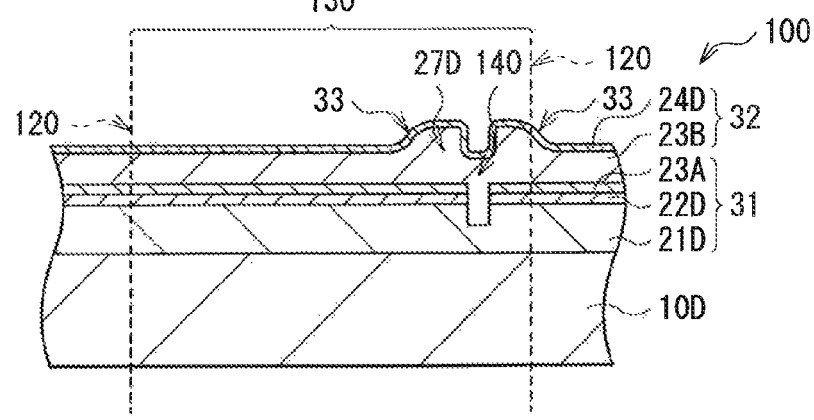
Figure 6A:
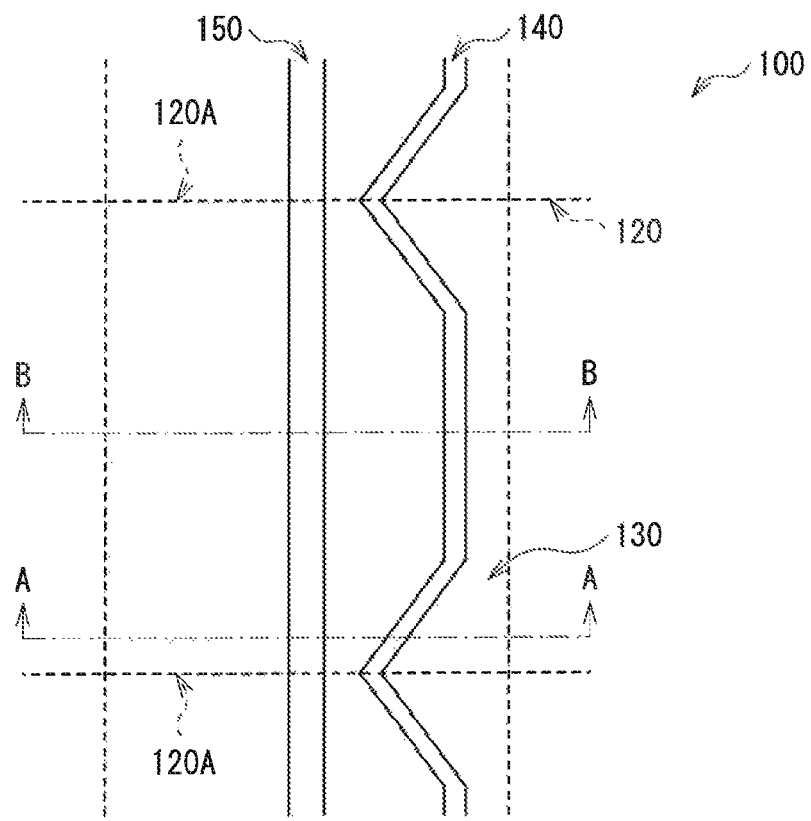
FIGS. 6A to 6C are a top view and cross sectional views for explaining a step following FIGS. 5A to 5C.
Figure 6B:
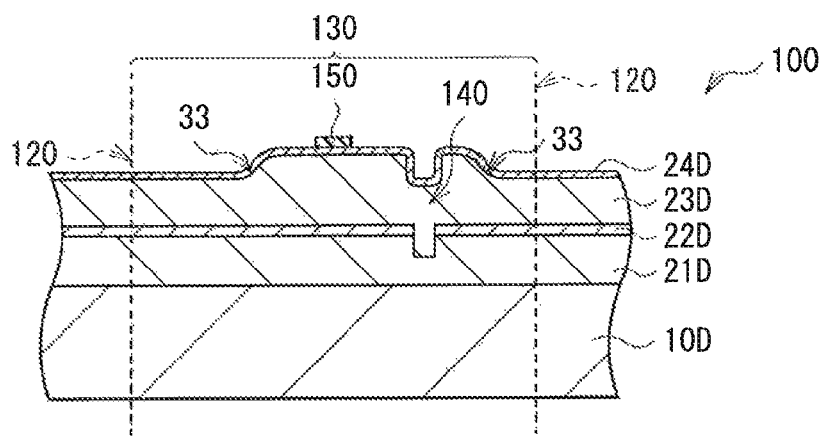

FIG. 3A, FIG. 4A, FIG. 5A, FIG. 6A, and FIG. 7A illustrate a top face structure of a wafer 100 in a manufacturing process. FIG. 3B illustrates a cross sectional structure taken along line A-A of FIG. 3A, FIG. 4B illustrates a cross sectional structure taken along line A-A of FIG. 4A, and FIG. 5B illustrates a cross sectional structure taken along line A-A of FIG. 5A, respectively. FIG. 6B illustrates a cross sectional structure taken along line A-A of FIG. 6A, and FIG. 7B illustrates a cross sectional structure taken along line A-A of FIG. 7A, respectively. The strip-shaped region colored in black in FIG. 3A, FIG. 4A, and FIG. 5A is a region corresponding to a strip-shaped ridge region 110 that is to be subsequently a place where the ridge 25 is formed. A dotted line illustrated in FIGS. 3A, 3B to FIGS. 7A to 7C is a region corresponding to a cut region 120 having a lattice-shaped layout, which is subsequently to be a cut place of the wafer 100 (substrate 10D).

First, the surface of the substrate 10D is cleaned by, for example, thermal cleaning. D affixed to the end of the substrate 10D means that the substrate is in a state before finally becoming the substrate 10 in the manufacturing process of the chip-shaped laser diode 1, and further means that the substrate 10D is made of the same material as that of the substrate 10. In the following description, for a case that D is affixed to the end of an element, D will have the same meaning as the foregoing meaning.

Next, for example, a lower cladding layer 21D, an active layer 22D, and an upper cladding layer 23A are sequentially grown over the cleaned substrate 10D by using MOCVD method to form a semiconductor layer 31 (first semiconductor layer) (FIGS. 3A and 3B). The upper cladding layer 23A is, for example, a thin semiconductor layer made of the same material as that of the upper cladding layer 23. The upper cladding layer 23A is a semiconductor layer to become an upper cladding layer 23D together with an after-mentioned upper cladding layer 23B, and to finally become the upper cladding layer 23. In forming the semiconductor layer 31, for example, an electron barrier layer (not illustrated) to inhibit electron overflow may be formed between the active layer 22D and the upper cladding layer 23A. Further, according to needs, other layer may be added, or the upper cladding layer 23A may be omitted.

Next, a groove 140 is formed in a location that is at least one region of both sides of the ridge region 110, which is a region apart from the ridge region 110, and which is at least outer edge of one device region 130 within the one device region 130 surrounded by the cut region 120 in the top face of the semiconductor layer 31. For example, as illustrated in FIGS. 4A and 4B, where a pair of region opposed to each other with the device region 130 in between is regarded to as a pair of side regions 120A in the cut region 120, the groove 140 is formed to be extended from the vicinity of one of the pair of side regions 120A to the vicinity of the other of the pair of side regions 120A.

FIGS. 4A and 4B exemplify a case that the groove 140 is formed not only in the one device region 130 but also continuously in other device regions 130 contacted with the side region 120A. That is, FIGS. 4A and 4B exemplify a case that the groove 140 is formed to stride over the side region 120A. In the case where the groove 140 is formed in a plurality of device regions 130, the groove 140 may not stride over the side region 120A. That is, it is possible that the groove 140 is not contacted with the side region 120A, but is formed only in the device region 130.

Further, in the foregoing step, for example, as illustrated in FIGS. 4A and 4B, the groove 140 is formed to be extended in the direction in which as the groove 140 becomes close to the cut region 120, a gap (distance) between the groove 140 and the ridge region 110 becomes smaller in the vicinity of the side region 120A. The groove 140 is to be the groove 26 finally. The groove 140 has a depth with a degree that the groove 140 is not buried in subsequently layering a semiconductor layer 32. The depth thereof is, for example, about from 1 to 3 μm both inclusive.

Next, the semiconductor layer 32 (second semiconductor layer) composed of at least the upper cladding layer 23B is formed on the top face of the semiconductor layer 31 including the groove 140. For example, as illustrated in FIGS. 5A to 5C, the upper cladding layer 23B and a contact layer 24D are sequentially grown on the top face of the semiconductor layer 31 including the groove 140 to form the semiconductor layer 32. The upper cladding layer 23B is, for example, a semiconductor layer made of the same material as that of the upper cladding layer 23. The upper cladding layer 23B is a semiconductor layer to finally become the upper cladding layer 23 together with the foregoing upper cladding layer 23A. At this time, in the semiconductor layer 32, only the place around the groove 140 is naturally formed thick, and an inclined face 33 whose thickness is smoothly and moderately decreased as its place is apart from the groove 140 is formed. That is, in forming the semiconductor layer 32, a discontinuous structure is not formed on both sides of the ridge 110. Since the crystal growth rate in the inclined face in the groove 140 is slower than that of the other sections and the Group III element is flown into the vicinity of the groove 140, only the section around the groove 140 is naturally formed thick.

Figure 6C:
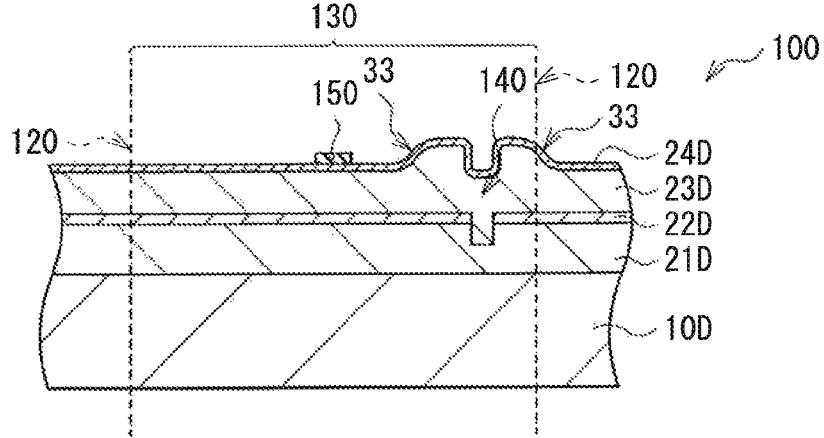
Figure 7A:
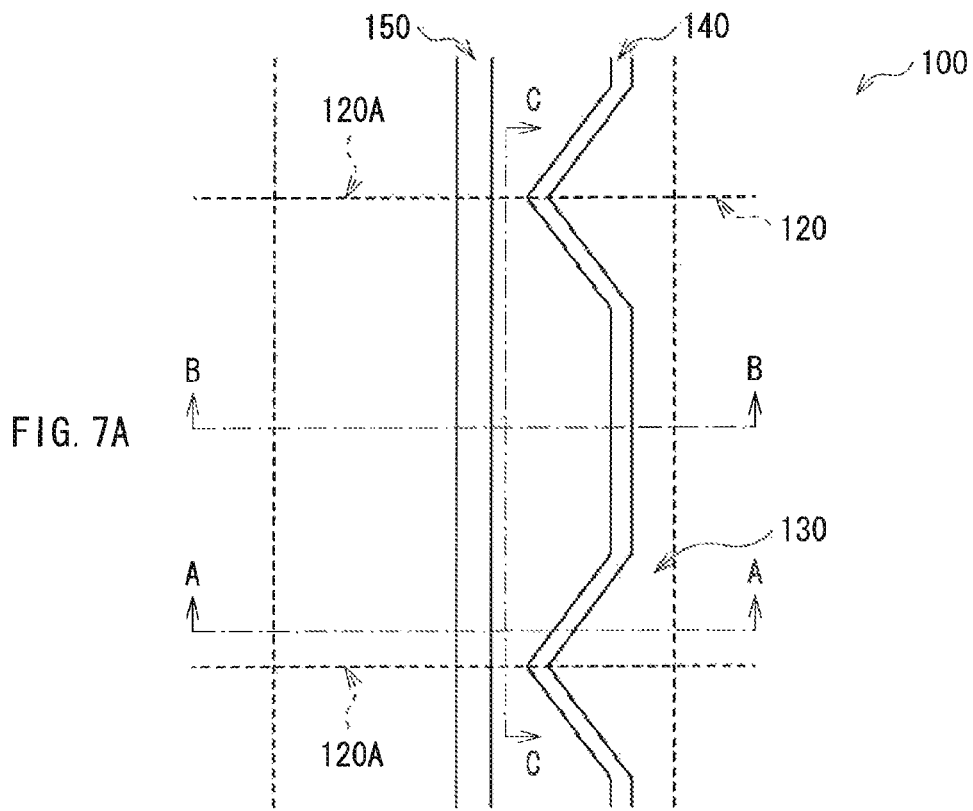
FIGS. 7A to 7C are a top view and cross sectional views for explaining a step following FIGS. 6A to 6C.
Figure 7B:
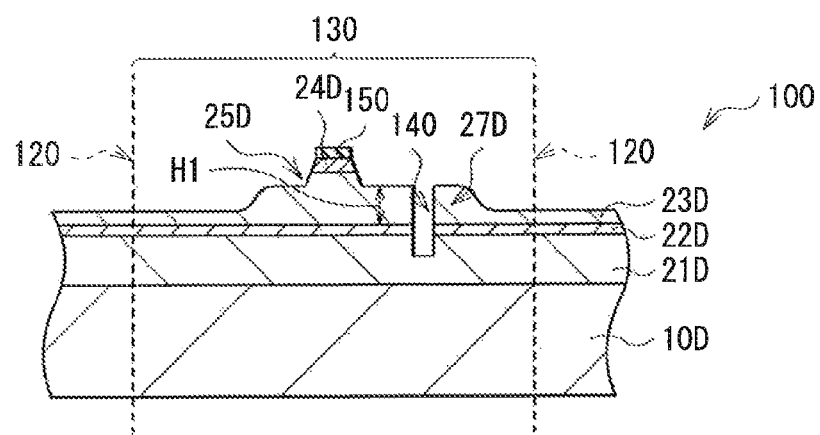
Figure 7C:
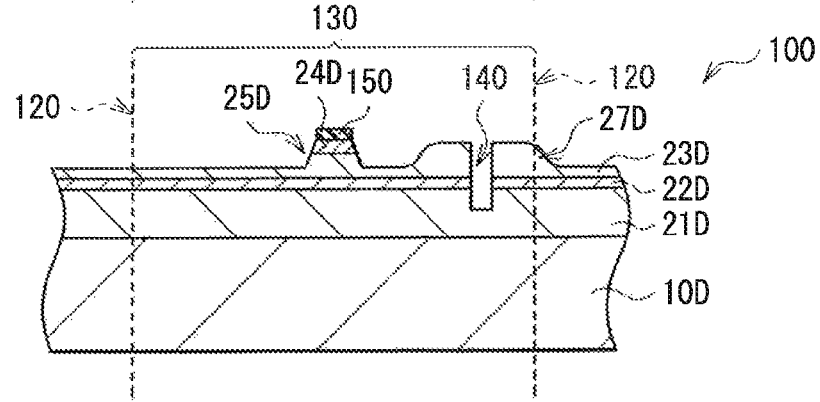

Next, a strip-shaped insulating layer 150 is formed in a region corresponding to the ridge region 110 in the top face of the semiconductor layer 32 (FIGS. 6A to 6C). As illustrated in FIGS. 6A to 6C, it is possible that the insulating layer 150 is formed not only in the one device region 130, but also continuously in other device regions 130 contacted with the side region 120A. Subsequently, the semiconductor layer 32 is selectively etched by using the insulating layer 150 as a mask (FIGS. 7A to 7C). Thereby, a ridge 25D is formed in a section directly under the insulating layer 150 in the semiconductor layer 32. Further, the etching remaining amount is large by the naturally and thickly formed portion in the section around the groove 140 that has been naturally formed thick in the previous step. In the result, an upland section 27D is formed to be contacted with both side faces of the ridge 25D in the vicinity of the side region 120A, and to be apart from the ridge 25D in the other regions.

Figure 8:
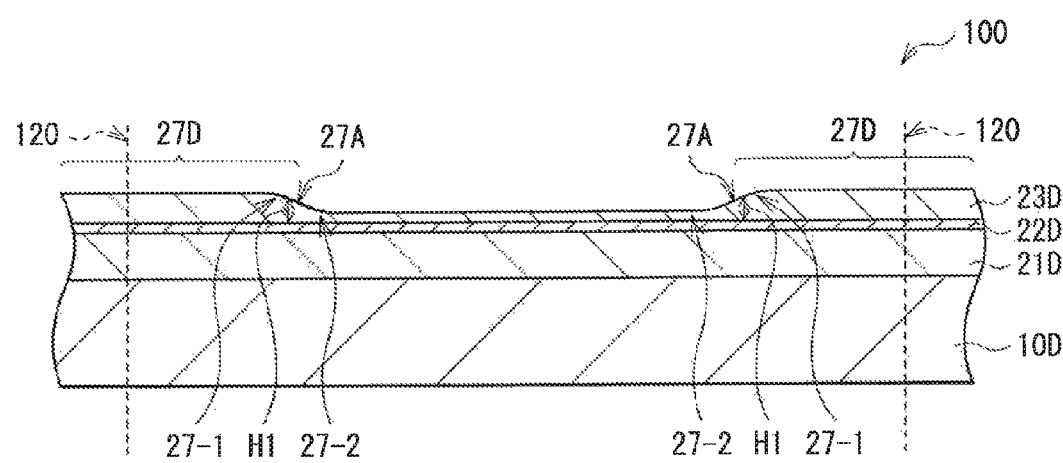
FIG. 8 is a cross sectional view for explaining a step following FIGS. 6A to 6C.

The upland section 27D is formed to be contacted with both side faces of the ridge 25D at least in the outer edge of the device region 130 in the region along the groove 140. Further, the upland section 27D is formed not only on both sides of the ridge 25D, but also directly under a section corresponding to the outer edge of the device region 130 in the ridge 25D. FIG. 8 exemplifies a case that the upland section 27D is formed not only directly under the section corresponding to the outer edge of the device region 130 in the ridge 25D, but also in a section directly under the side region 120A in the ridge 25D. FIG. 8 illustrates a cross sectional structure taken along line C-C of FIG. 7A, and illustrates a cross sectional structure when the surface contacted with both side faces of the ridge 25D is cut in the extending direction of the ridge 25D.

In the section contacted with both side faces of the ridge 25D in the upland section 27D, the thickness H1 from the active layer 22D to the surface contacted with both side faces of the ridge 25D is thicker in a place close to the cut region 120 (side region 120A), and thinner in a place close to the center of the device region 130. Further, in the upland section 27D, the height H1 is continuously changed from the thick section 27-1 (refer to FIG. 8) close to the cut region 120 (side region 120A) to the thin section 27-2 (refer to FIG. 8) close to the center of the device region 130. That is, in the upland section 27D, a continuous and moderate inclined face 27A is formed on the surface contacted with both side faces of the ridge 25D.

Next, though not illustrated, after the insulating layer 150 is removed, the upper electrode 28 is formed on the top face of the ridge 25. Further, according to needs, the thickness of the substrate 10 is adjusted as appropriate by lapping or the like. After that, the lower electrode 29 is formed on the rear face of the substrate 10. Subsequently, the substrate 10 is cleaved on a line corresponding to the side region 120A to form the wafer 100 into a bar shape. Thereby, one face of the cleaved faces becomes the front end face S1, and the other face of the cleaved faces becomes the rear end face S2. After that, a multilayer reflective film is formed on the front end face S1 and the rear end face S2. Finally, the bar-shaped wafer 100 is die-cut. Accordingly, the laser diode 1 of this embodiment is manufactured.

Action and Effect of the Laser Diode 1

Next, a description will be given of action and effect of the laser diode 1 of this embodiment.

In the laser diode 1 of this embodiment, in the case where a given current is applied to between the upper electrode 28 and the lower electrode 29, a current narrowed by the ridge 25 is injected into the current injection region (light emitting region 22A) of the active layer 22, and thereby light emission is generated due to electron-hole recombination. The light is reflected by the multilayer reflective film formed on the front end face S1 and the rear end face S2, laser oscillation with a given wavelength is generated, and the light is emitted outside from the front end face S1 side as a beam.

In this embodiment, light confinement in the lateral direction of the light guide is determined by a difference $\Delta n$ between an equivalent refractive index n1 of the ridge 25 and an equivalent refractive index n2 of the side of the ridge 25 (=n1−n2). The refractive index n1 in the ridge 25 is determined by epi-layer structure. Thus, in the ridge 25, the refractive index n1 in the vicinity of the end face is identical with the refractive index n1 in the central portion in the resonator direction. Meanwhile, regarding the side of the ridge 25, due to existence of the upland section 27, each value of the equivalent refractive index n2 in the resonant direction is different according to the position in the resonant direction. Specifically, the upland section 27 is contacted with both side faces of both end sections of the ridge 25, where the thickness H1 from the active layer 22 to the surface contacted with both side faces of the ridge 25 is larger on the resonator end face side (thick section 27-1), and is smaller on the central side of the ridge 25 (thin section 27-2).

Thereby, in both end sections of the ridge 25, the refractive index difference $\Delta n$ on the resonator end face side is smaller than the refractive index difference $\Delta n$ on the central side of the ridge 25, and the lateral direction refractive index distribution on the resonator end face side is more moderate than the lateral direction refractive index distribution on the central side of the ridge 25. In the result, the light spot size is magnified and the light density is decreased in the vicinity of the end face, and thus the COD level is able to be increased. Further, a leak current to the ridge side is able to be decreased in the central portion of the ridge 25, and thus the threshold current is able to be kept low. Further, the etching remaining amount is large in the vicinity of the end face. Thus, in the manufacturing process, damage to the active layer 22 by dry etching is decreased, and reliability is improved.

Further, in this embodiment, the moderate inclined face 27A is formed from the thick section 27-1 close to the resonator end face to the thin section 27-2 close to the center of the ridge 25, and the thickness H1 is continuously changed in the upland section 27. Thereby, the lateral direction refractive index distribution is continuously changed with moderation corresponding to moderation of the inclined face 27A from the thick section 27-1 to the thin section 27-2. Thus, compared to the existing case in which a step is generated on the surface of the ridge side, change in the resonator direction of the lateral direction refractive index distribution is more moderate, and change in the resonator direction of the optical mode shape is also more moderate. In the result, light scattering loss caused by change in the resonator direction of the optical mode shape is able to be decreased.

Further, in this embodiment, in the manufacturing process, in forming the semiconductor layer 32 on the top face of the semiconductor layer 31 including the groove 140, the semiconductor layer 32 is able to be formed under conditions similar to those in a case that the groove 140 is not provided on the top face of the semiconductor layer 31. Thus, crystal defect caused by the groove 140 provided on the top face of the semiconductor layer 31 is not increased. Accordingly, there is no possibility that the COD level is decreased.

In Japanese Unexamined Patent Application Publication No. 2002-158402, an insulating film pattern is formed on the substrate before crystal growth, and the band gap of the active layer is increased only in a section in the vicinity of the section corresponding to the end face. Thereby, in the vicinity of the end face, light absorption is decreased, and the COD level is able to be increased. However, in such a case, the growth conditions in the vicinity of the insulating film (for example, V/III ratio and the like) are largely deviated from the normal conditions. Thus, in the foregoing method described in Japanese Unexamined Patent Application Publication No. 2002-158402, there is a disadvantage that the crystal defect is increased, and the COD level is decreased.

Modified Example of First Embodiment

Figure 9:
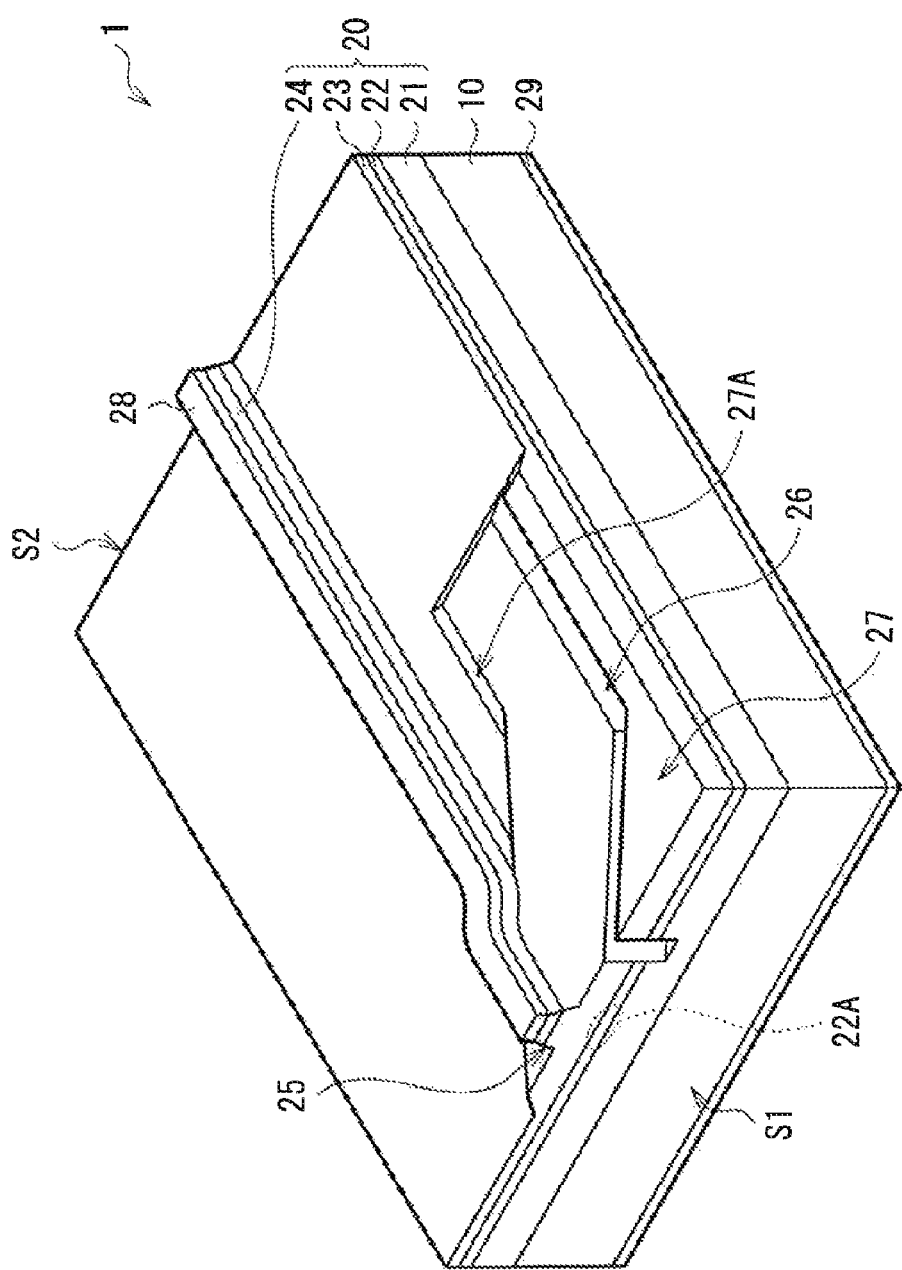
FIG. 9 is a perspective view of a modified example of the laser diode of FIG. 1.
Figure 10:
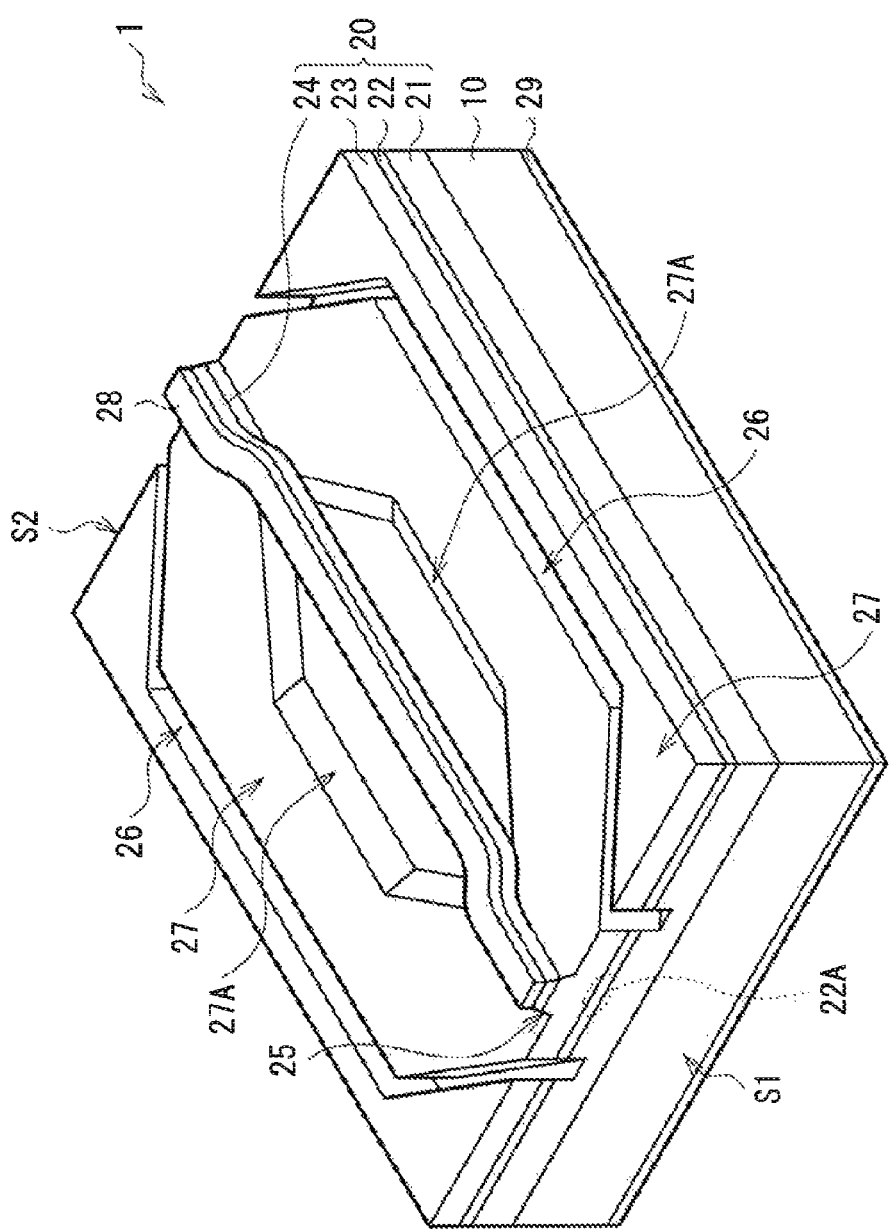
FIG. 10 is a perspective view of another modified example of the laser diode of FIG. 1.

The foregoing embodiment exemplifies the case that the groove 26 is provided from the front end face S1 (or in the vicinity of the front end face S1) to the rear end face S2 (or in the vicinity of the rear end face S2), and the upland section 27 is provided from the front end face S1 to the rear end face S2. However, for example, as illustrated in FIG. 9, it is possible that the groove 26 is provided only on the front end face S1 side (or in the vicinity of the front end face S1), and the upland section 27 is provided only on the end face (the front end face S1) side in the proximity of the groove 26 (or the end face (the front end face S1) in the proximity of the groove 26 and in the vicinity thereof). At this time, the upland section 27 is provided being contacted with both side faces of the ridge in the end face (the front end face S1) in the proximity of the groove 26 and in the vicinity thereof. Further, for example, though not illustrated, it is possible that the groove 26 is provided only on the rear end face S2 side (or in the vicinity of the rear end face S2), and the upland section 27 is provided only in the end face (the rear end face S2) in the proximity of the groove 26 side (or the end face (the rear end face S2) in the proximity of the groove 26 and in the vicinity thereof). At this time, the upland section 27 is provided being contacted with both side faces of the ridge in the end face (the rear end face S2) in the proximity of the groove 26 and in the vicinity thereof. Further, the foregoing embodiment exemplifies the case that the groove 26 is provided only on a single side of both sides of the ridge 25. However, for example, as illustrated in FIG. 10, the groove 26 may be provided on both sides of the ridge 25. In this case, the upland section 27 is provided from the front end face S1 to the rear end face S2 on both sides of the ridge 25. Further, for example, as illustrated in FIG. 11, it is possible that the groove 26 and the upland section 27 are provided on both sides of the ridge 25, the groove 26 is provided only on the front end face S1 side (in the vicinity of the front end face S1), and the upland section 27 is provided only on the front end face S1 side (front end face S1 and in the vicinity thereof).

Figure 11:
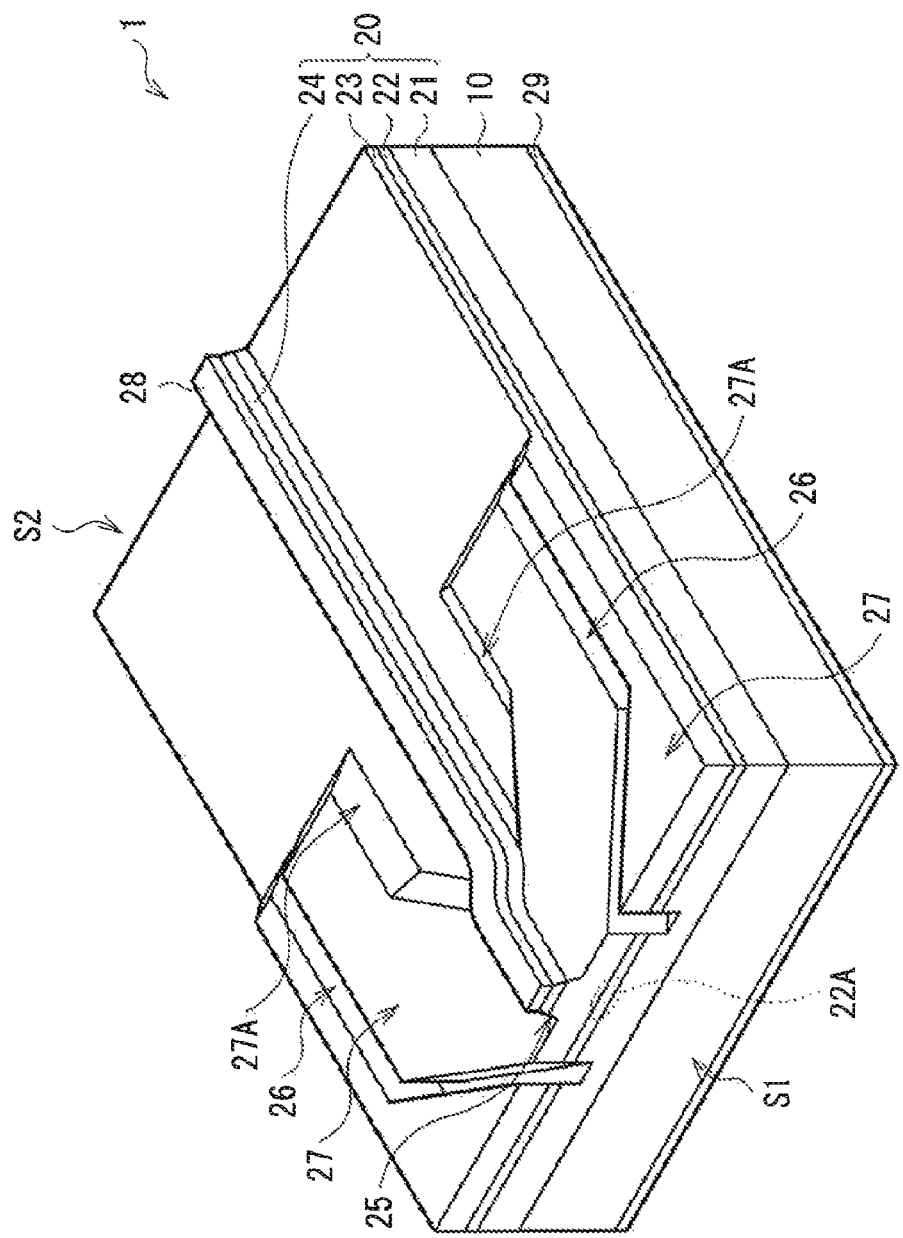
FIG. 11 is a perspective view of still another modified example of the laser diode of FIG. 1.

In the case where the groove 26 and the upland section 27 are provided only on the front end face S1 side as illustrated in FIG. 9 and FIG. 11, in the manufacturing process, first, the groove 140 is formed only in the outer edge of the device region 130. Subsequently, the semiconductor layer 32 is formed on the surface including the groove 140. After that, the insulating layer 150 is formed correspondingly to the ridge region 110. The semiconductor layer 32 is selectively etched by using the insulating layer 150 as a mask. Accordingly, the upland section 27D may be formed to be contacted with both side faces of the ridge 25D in the vicinity of the region where the groove 130 is formed in the outer edge of the device region 130.

Second Embodiment

Configuration of Laser Diode 2

Figure 12:
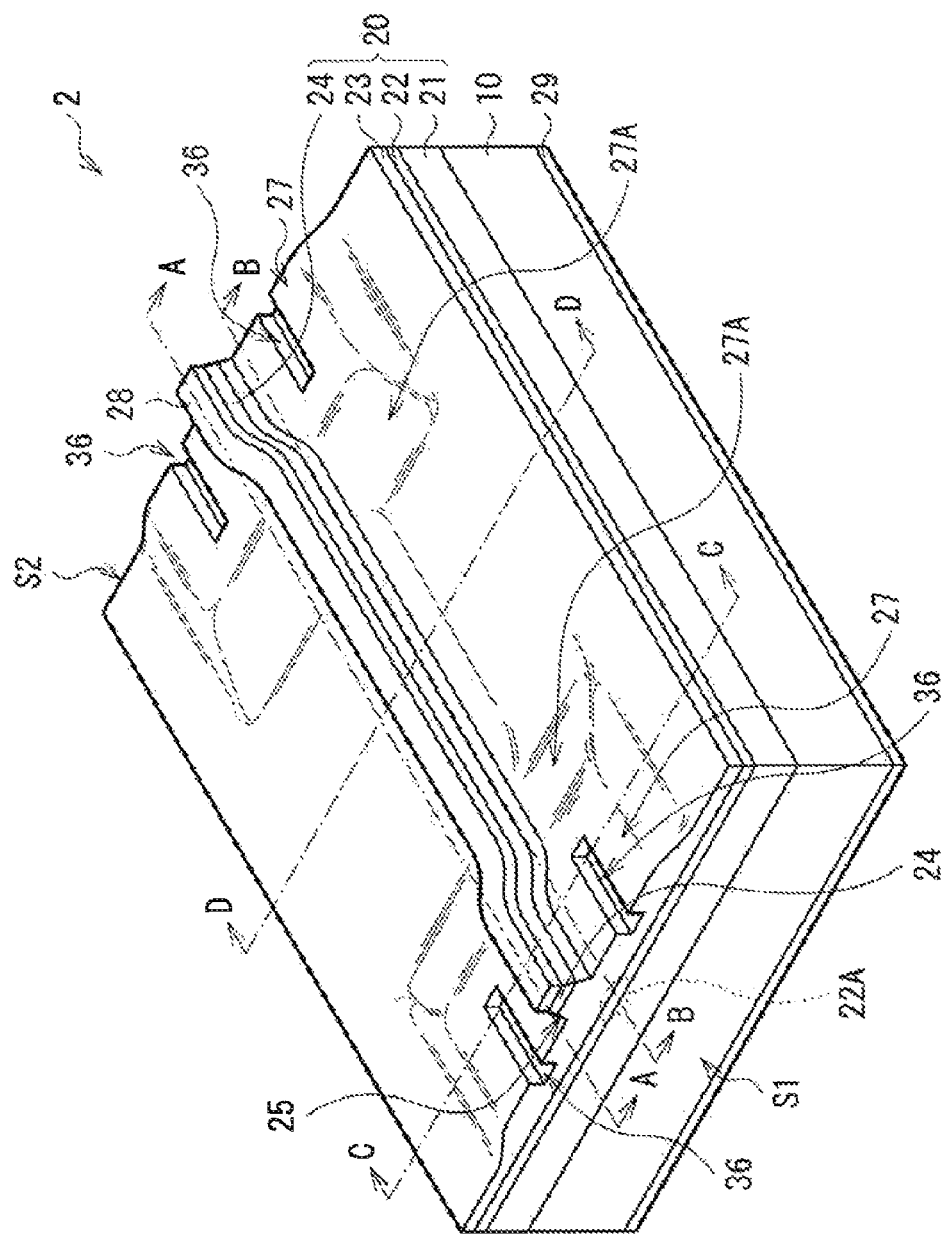
FIG. 12 is a perspective view of a laser diode according to a second embodiment of the invention.

FIG. 12 is a perspective view illustrating a schematic configuration of a laser diode 2 according to a second embodiment of the invention. FIG. 13A illustrates a cross sectional configuration taken along line A-A of the laser diode 2 of FIG. 12, and FIG. 13B illustrates a cross sectional configuration taken along line B-B of the laser diode 2 of FIG. 12, respectively. FIG. 13C illustrates a cross sectional configuration taken along line C-C of the laser diode 2 of FIG. 12, and FIG. 13D illustrates a cross sectional configuration taken along line D-D of the laser diode 2 of FIG. 12, respectively. FIGS. 12 and 13A to 13D are schematic views and thus the dimensions and the shapes thereof are different from the actual dimensions and the actual shapes.

The configuration of the laser diode 2 of this embodiment is different from the configuration of the laser diode 1 of the foregoing embodiment in that the laser diode 2 includes a groove 36 having a depth different from that of the groove 26 of the foregoing embodiment. Further, the method of manufacturing the laser diode 2 is different from the manufacturing method of the foregoing embodiment. Thus, a description will be mainly given of a difference from the foregoing embodiment, and explanation of points common to those of the foregoing embodiment will be omitted as appropriate.

The groove 36 is provided at least on one of both sides of the ridge 25. Further, the groove 36 is provided in the vicinity of at least one end face (the front end face S1 or the rear end face S2). The groove 36 may be provided being contacted with at least one end face. For example, as illustrated in FIG. 12, the groove 36 is provided on both sides of the ridge 25. Further, for example, as illustrated in FIG. 12, the groove 36 is provided only in the vicinity of the front end face S1 and in the vicinity of the rear end face S2, and is provided being contacted with the front end face S1 and the rear end face S2. That is, the groove 36 is not provided in a region apart from the front end face S1 and the rear end face S2.

The groove 36 is, for example, extended in the direction in parallel with the extending direction of the ridge 25 in the vicinity of the front end face S1 and the rear end face S2. The groove 36 may be extended in the direction in which a gap (distance) between the groove 36 and the ridge 25 becomes smaller as the position of the groove 36 becomes close to the resonator end face in the vicinity of the front end face S1 and the rear end face S2. As illustrated in FIG. 12 and FIG. 13C, the groove 36 has a depth from the top face side of the semiconductor layer 20 to within a few length of the active layer 22, and does not penetrate through the active layer 22.

In this embodiment, the upland section 27 is provided in a region along the groove 36, that is, on both sides of the groove 36. The upland section 27 is provided being contacted with both side faces of both end sections of the ridge 25 in the resonator end faces (the front end face S1 and the rear end face S2) in the proximity of the groove 36 (or being contacted with the groove 36) and in the vicinity thereof. In this embodiment, the groove 36 does not exist in the region apart from the resonator end face (the front end face S1 and the rear end face S2). Thus, the upland section 27 does not exist in a region apart from the resonator end face (the front end face S1 and the rear end face S2) as well. That is, the upland section 27 is provided only in the vicinity of the front end face S1 and in the vicinity of the rear end face S2 as the groove 36 is.

In the same manner as that of the foregoing embodiment, the thickness H1 of the upland section 27 is larger on the resonator end face (the front end face S1 and the rear end face S2) side, and is smaller on the central side of the ridge 25. Further, the upland section 27 has the inclined face 27A that is moderately inclined from the thick section 27-1 on the resonator end face side to the thin section 27-2 on the central side of the ridge 25, and does not have a step generated by a selective etching or the like. Thus, in the light guide including the ridge 25 and the section of both sides of the ridge 25 (upland section 27), the lateral direction refractive index distribution in the vicinity of both end faces is more moderate than the lateral direction refractive index distribution in the central portion in the resonator direction.

In the same manner as that of the foregoing embodiment, both end sections of the upland section 27 are provided not only on both sides of both end sections of the ridge 25, but also directly under both end sections of the ridge 25 in the vicinity of the front end face S1 and the rear end face S2. Thus, as illustrated in FIG. 13A, if viewed from the lamination in-plane direction of the semiconductor layer 20, the ridge 25 has swell in the lamination direction in the vicinity of the end section of the ridge 25. "Swell" section in the ridge 25 corresponds to the inclined face 25A that is moderately inclined in the extending direction of the ridge 25, and does not have a step generated by a selective etching or the like. The thickness of the ridge 25 itself does not depend on each region of ridge 25, but is almost constant.

Manufacturing Method of the Laser Diode 2

The laser diode 2 having the foregoing configuration is able to be manufactured, for example, as follows.

Figure 14A:
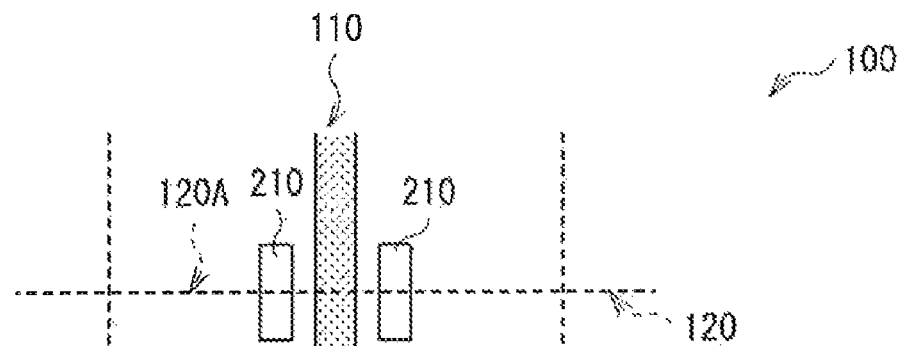
FIGS. 14A and 14B are a top view and a cross sectional view for explaining a method of manufacturing the laser diode of FIG. 12.
Figure 14B:
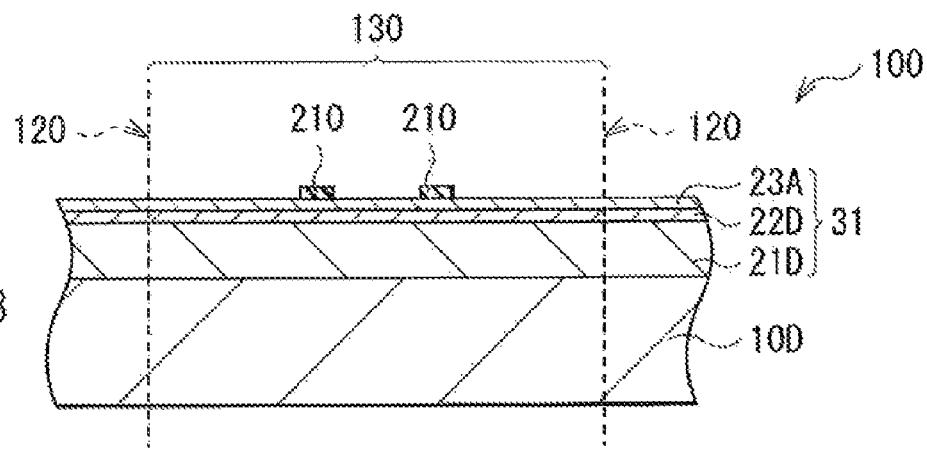
Figure 15A:
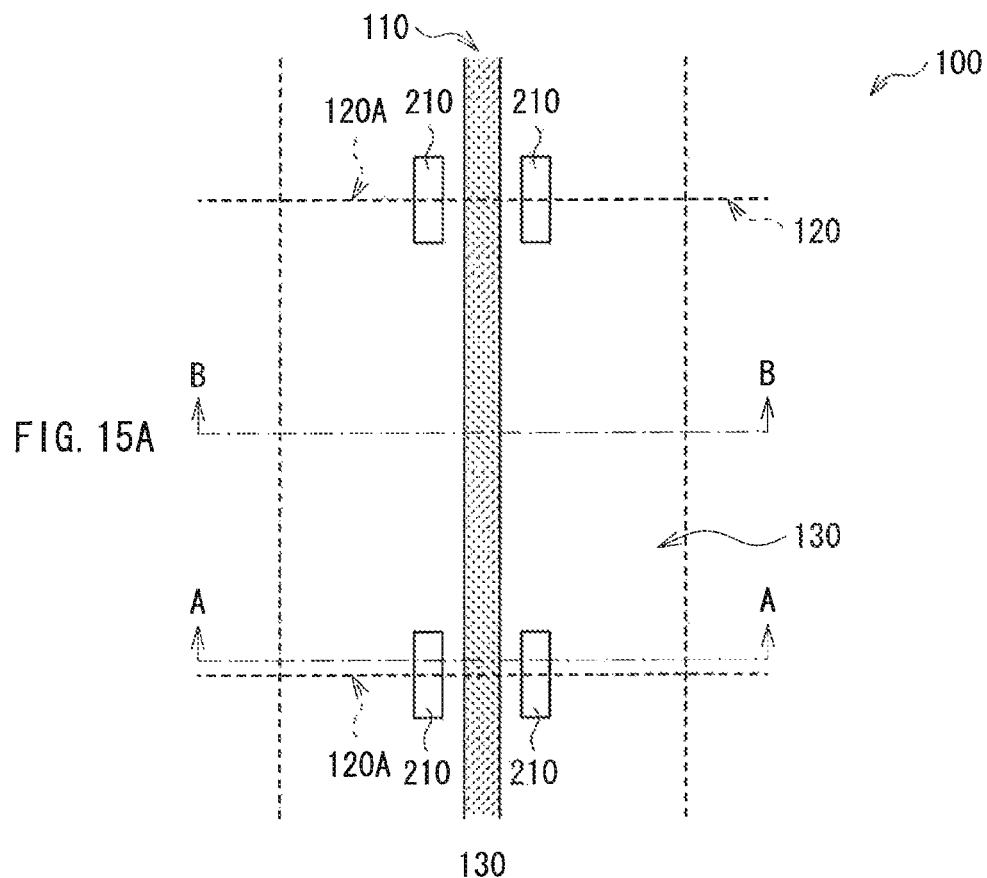
FIGS. 15A to 15C are a top view and cross sectional views for explaining a step following FIGS. 14A and 14B.
Figure 15B:
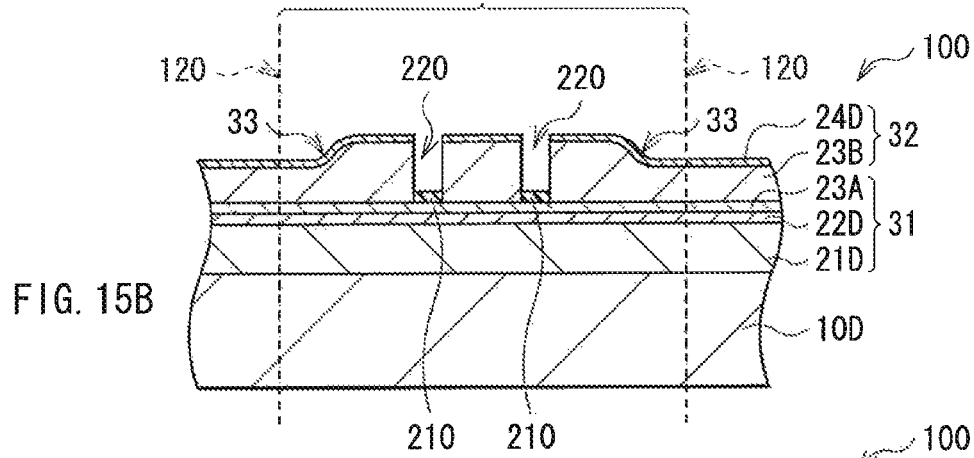
Figure 15C:
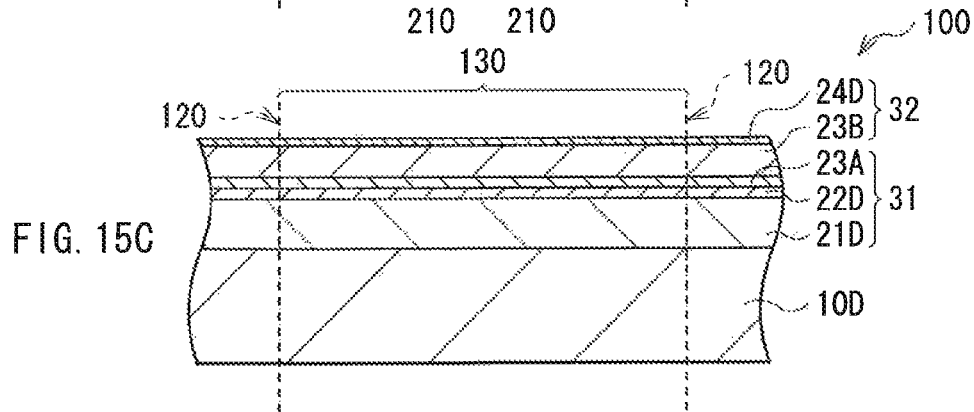

FIG. 14A, FIG. 15A, FIG. 16A, and FIG. 17A illustrate a top face structure of the wafer 100 in a manufacturing process. FIG. 14B illustrates a cross sectional structure taken along line A-A of FIG. 14A, FIG. 15B illustrates a cross sectional structure taken along line A-A of FIG. 15A, and FIG. 16B illustrates a cross sectional structure taken along line A-A of FIG. 16A, respectively. FIG. 17B illustrates a cross sectional structure taken along line A-A of FIG. 17A. The strip-shaped region colored in black in FIG. 14A, and FIG. 15A is a region corresponding to the strip-shaped ridge region 110 that is to be subsequently a place where the ridge 25 is formed. A dotted line illustrated in FIGS. 14A and 14B to FIGS. 17A to 17C is a region corresponding to the cut region 120 having a lattice-shaped layout, which is subsequently to be a cut place of the wafer 100 (substrate 10D).

First, in the same manner as that of the foregoing embodiment, the semiconductor layer 31 (first semiconductor layer) is formed on the substrate 10D by using, for example, MOCVD method (refer to FIGS. 3A and 3B). Next, an insulating layer 210 (first insulating layer) is formed in a location, which is at least one region of both sides of the ridge region 110, which is a region apart from the ridge region 110, and which is at least outer edge of one device region 130 within the one device region 130 surrounded by the cut region 120 in the top face of the semiconductor layer 31. For example, as illustrated in FIGS. 14A and 14B, the insulating layer 210 is formed in one side region 120A and in the vicinity thereof and the other side region 120A and in the vicinity thereof. That is, the insulating layer 210 is formed only in the outer edge of the device region 130.

FIGS. 14A and 14B exemplify a case that the insulating layer 210 is formed not only in the one device region 130 but also continuously in other device regions 130 contacted with the side region 120A. That is, FIGS. 14A and 14B exemplify a case that the insulating layer 210 is formed to stride over the side region 120A. In the case where the insulating layer 210 is formed in a plurality of device regions 130, the insulating layer 210 may not stride over the side region 120A. That is, it is possible that the insulating layer 210 is not contacted with the side region 120A, but is formed only in the device region 130.

Further, in the foregoing step, for example, as illustrated in FIGS. 14A and 14B, the insulating layer 210 is formed to be extended in the direction in which a gap (distance) between the insulating layer 210 and the ridge region 110 becomes constant (that is, in a direction in parallel with the extending direction of the ridge region 110) in the vicinity of the side region 120A. It is also possible that the insulating layer 210 is formed to be extended in the direction in which a gap (distance) between the insulating layer 210 and the ridge region 110 becomes smaller as the insulating layer 210 becomes close to the cut region 120.

Next, the semiconductor layer 32 (second semiconductor layer) composed of at least the upper cladding layer 23B is formed in the region other than the insulating layer 210 in the top face of the semiconductor layer 31. For example, as illustrated in FIGS. 15A to 15C, the upper cladding layer 23B and the contact layer 24D are sequentially grown in the region other than the insulating layer 210 in the top face of the semiconductor layer 31 to form the semiconductor layer 32. At this time, in the semiconductor layer 32, only the place around the insulating layer 210 is naturally formed thick, and a groove 220 is formed directly above the insulating layer 210. Further, an inclined face 33 whose thickness is smoothly and moderately decreased as its place is apart from the insulating layer 210 (groove 220) is formed. That is, in forming the semiconductor layer 32, a discontinuous structure is not formed on both sides of the ridge 110. Since crystal is hardly grown on the surface of the insulating layer 210 and the Group III element is flown into the vicinity of the insulating layer 210, only the section around the groove 220 is naturally formed thick.

Figure 16A:
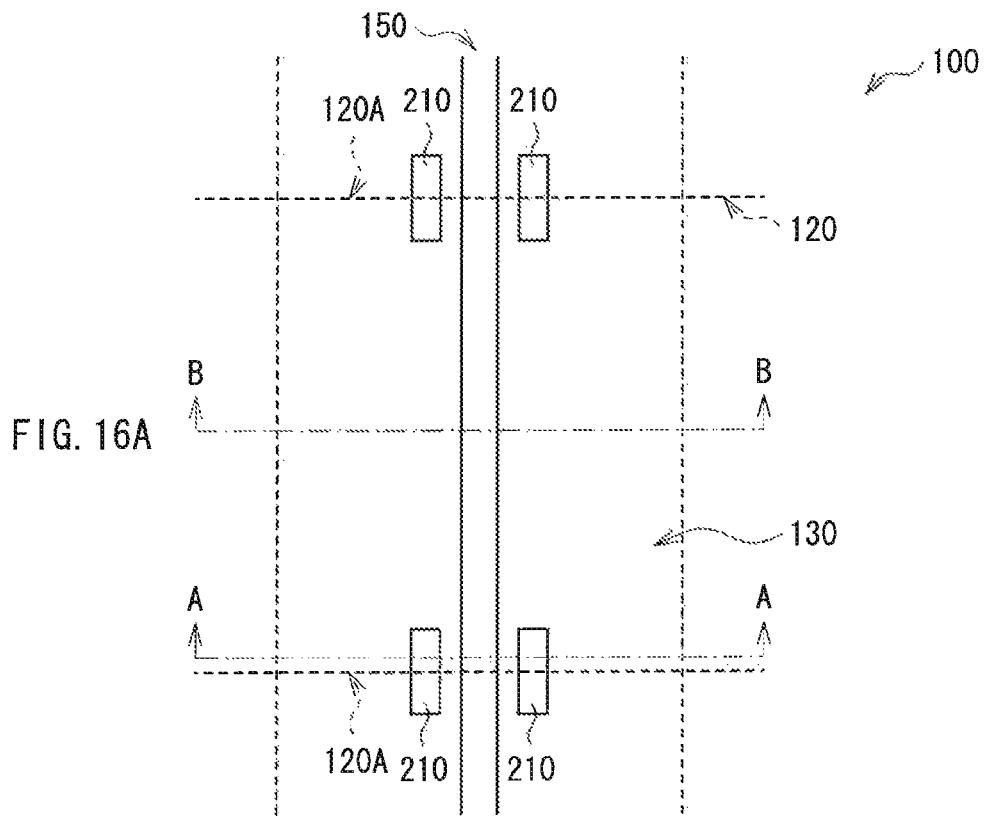
FIGS. 16A to 16C are a top view and cross sectional views for explaining a step following FIGS. 15A to 15C.
Figure 16B:
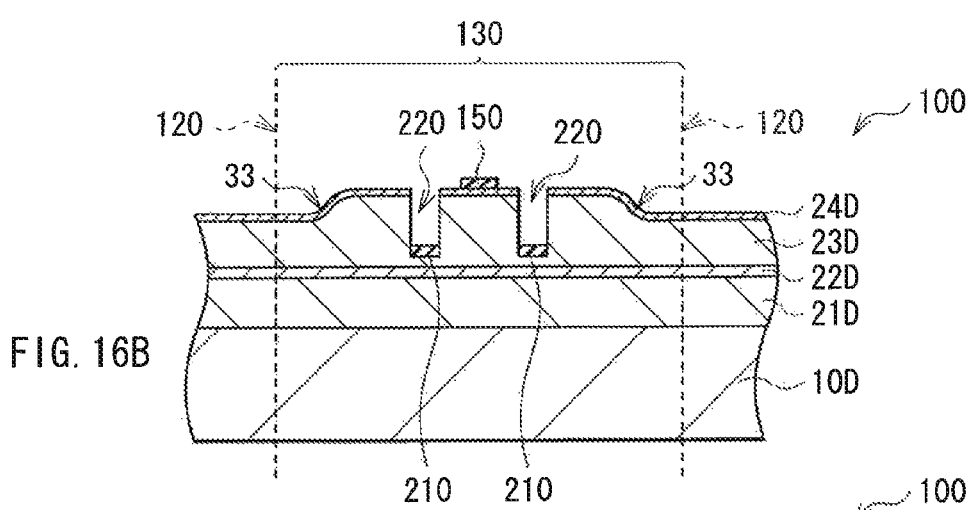
Figure 16C:
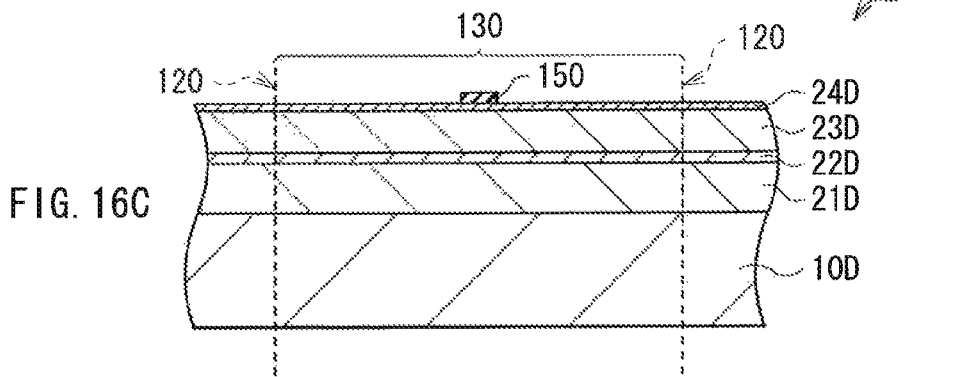
Figure 17A:
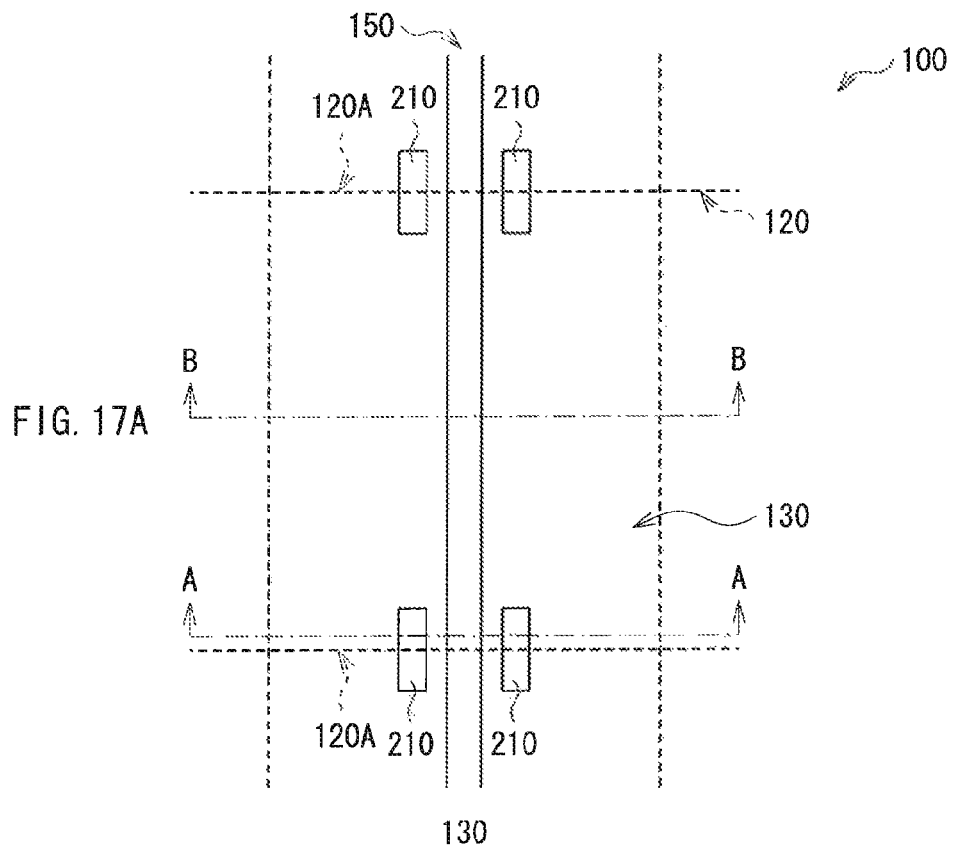
FIGS. 17A to 17C are a top view and cross sectional views for explaining a step following FIGS. 16A to 16C.
Figure 17B:
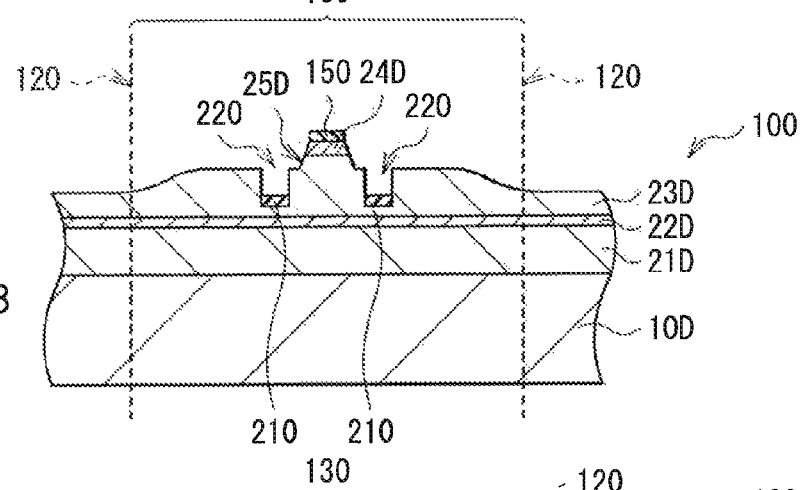
Figure 17C:
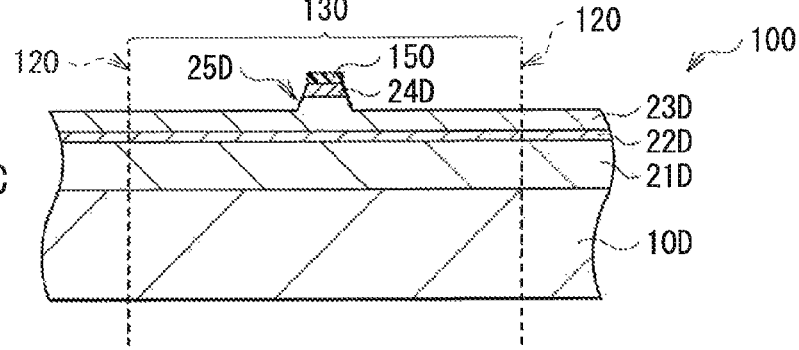

Next, the strip-shaped insulating layer 150 is formed in a region corresponding to the ridge region 110 in the top face of the semiconductor layer 32 (FIGS. 16A to 16C). As illustrated in FIGS. 16A to 16C, it is possible that the insulating layer 150 is formed not only in the one device region 130, but also continuously in other device regions 130 contacted with the side region 120A. Subsequently, the semiconductor layer 32 is selectively etched by using the insulating layer 150 as a mask (FIGS. 17A to 17C). Thereby, in a section directly under the insulating layer 150 in the semiconductor layer 32, the ridge 25D is formed. Further, in the section around the insulating layer 210 that has been naturally formed thick in the previous step, the etching remaining amount is large by the naturally and thickly formed portion. In the result, the upland section 27D is formed to be contacted with both side faces of the ridge 25D in the vicinity of the side region 120A, and to be apart from the ridge 25D in the other regions.

The upland section 27D is formed to be contacted with both side faces of the ridge 25D in at least the outer edge of the device region 130 in the region along the insulating layer 210 (groove 220). Further, the upland section 27D is formed not only on both sides of the ridge 25D, but also directly under a section corresponding to the outer edge of the device region 130 in the ridge 25D. In this embodiment, for example, as illustrated in FIG. 8, the upland section 27D is formed not only directly under the section corresponding to the outer edge of the device region 130 in the ridge 25D, but also in a section directly under the side region 120A in the ridge 25D as well.

In the section contacted with both side faces of the ridge 25D in the upland section 27D, the thickness H1 from the active layer 22D to the surface contacted with both side faces of the ridge 25D is larger in a place close to the cut region 120 (side region 120A), and is smaller in a place close to the center of the device region 130. Further, in the upland section 27D, the height H1 is continuously changed from the thick section 27-1 (refer to FIG. 8) close to the cut region 120 (side region 120A) to the thin section 27-2 (refer to FIG. 8) close to the center of the device region 130. That is, in the upland section 27D, the continuous and moderate inclined face 27A is formed on the surface contacted with both side faces of the ridge 25D.

Next, after the insulating layer 150 is removed, the upper electrode 28 is formed on the top face of the ridge 25. Further, according to needs, the thickness of the substrate 10 is adjusted as appropriate by lapping or the like. After that, the lower electrode 29 is formed on the rear face of the substrate 10. Subsequently, the substrate 10 is cleaved on a line corresponding to the side region 120A to form the wafer 100 into a bar shape. Thereby, one face of the cleaved faces becomes the front end face S1, and the other face of the cleaved faces becomes the rear end face S2. After that, a multilayer reflective film is formed on the front end face S1 and the rear end face S2. Finally, the bar-shaped wafer 100 is die-cut. Accordingly, the laser diode 2 of this embodiment is manufactured.

Action and Effect of the Laser Diode 2

Next, a description will be given of action and effect of the laser diode 2 of this embodiment.

In the same manner as that of the foregoing embodiment, in the case where a given current is applied to the upper electrode 28 and the lower electrode 29, a current narrowed by the ridge 25 is injected into the current injection region (light emitting region 22A) of the active layer 22, and thereby light emission is generated due to electron-hole recombination. The light is reflected by the multilayer reflective film formed on the front end face S1 and the rear end face S2, laser oscillation with a given wavelength is generated, and the light is emitted outside from the front end face S1 side as a laser beam.

In this embodiment, in the same manner as that of the foregoing embodiment, the upland section 27 is contacted with both side faces of both end sections of the ridge 25, where the thickness H1 from the active layer 22 to the surface contacted with both side faces of the ridge 25 is larger on the resonator end face side (thick section 27-1), and is smaller on the central side of the ridge 25 (thin section 27-2). Thereby, in both end sections of the ridge 25, the refractive index difference Δn on the resonator end face side is smaller than the refractive index difference Δn on the central side of the ridge 25, and the lateral direction refractive index distribution on the resonator end face side is more moderate than the lateral direction refractive index distribution on the central side of the ridge 25. In the result, in the vicinity of the end face, the light spot size is magnified and the light density is decreased, and thus the COD level is able to be increased. Further, in the central portion of the ridge 25, a leak current to the ridge side is able to be decreased, and thus the threshold current is able to be kept low. Further, since the ridge remaining amount is large in the vicinity of the end face. Thus, in the manufacturing process, damage to the active layer 22 by dry etching is decreased, and reliability is improved.

Further, in this embodiment, again, in the upland section 27, the moderate inclined face 27A is formed from the thick section 27-1 close to the resonator end face to the thin section 27-2 close to the center of the ridge 25, and the thickness H1 is continuously changed. Thereby, the lateral direction refractive index distribution is continuously changed with moderation corresponding to moderation of the inclined face 27A from the thick section 27-1 to the thin section 27-2. Thus, compared to the existing case in which a step is generated on the surface of the ridge side, change in the resonator direction of the lateral direction refractive index distribution is more moderate, and change in the resonator direction of the optical mode shape is also more moderate. In the result, light scattering loss caused by change in the resonator direction of the optical mode shape is able to be decreased.

Further, in this embodiment, in the manufacturing process, in forming the semiconductor layer 32 on the top face of the semiconductor layer 31, the semiconductor layer 32 is able to be formed under conditions similar to those in a case that the insulating layer 210 is not provided on the top face of the semiconductor layer 31. Thus, crystal defect caused by the insulating layer 210 provided on the top face of the semiconductor layer 31 is not increased. Accordingly, there is no possibility that the COD level is decreased.

Modified Example of Second Embodiment

Figure 18:
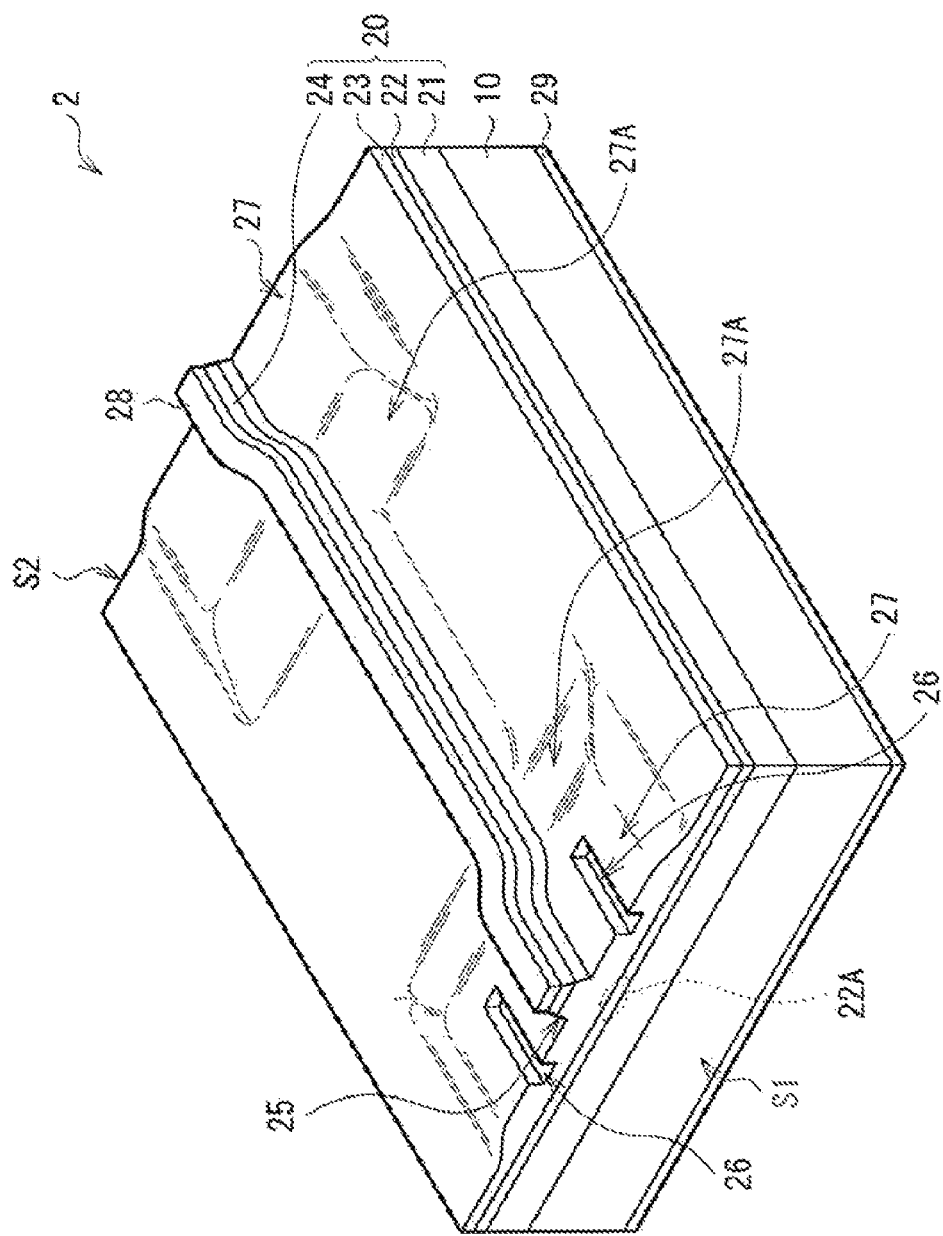
FIG. 18 is a perspective view for explaining a modified example of the laser diode of FIG. 12.
Figure 19A:
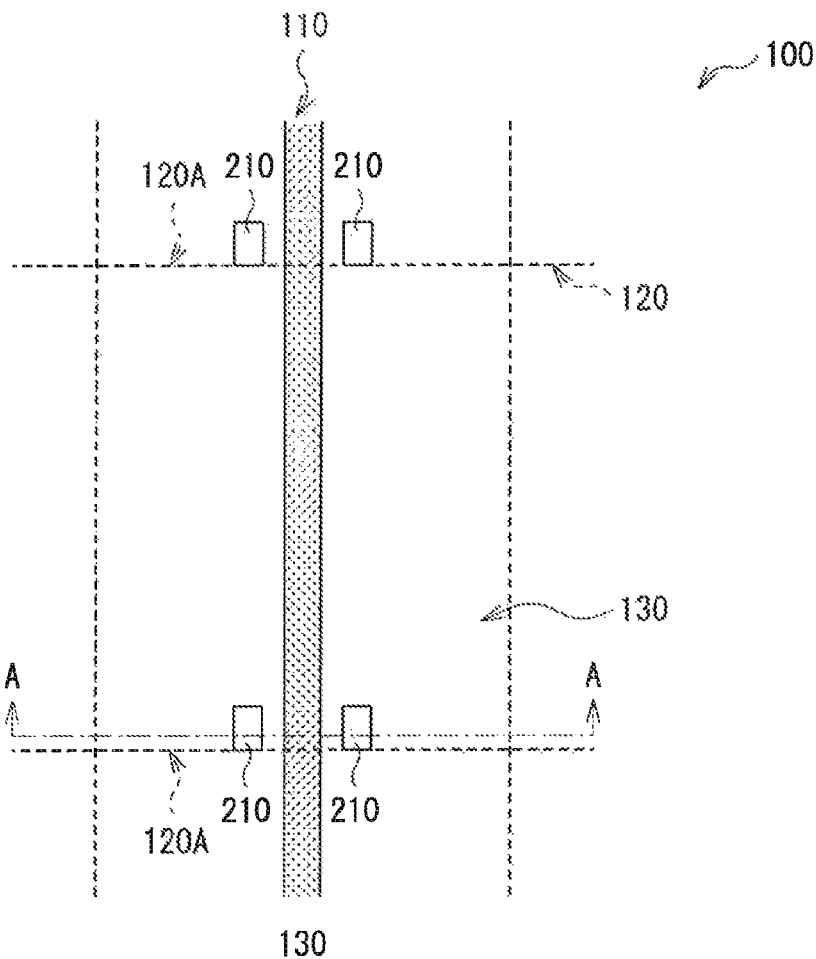
FIGS. 19A and 19B are a top view and a cross sectional view for explaining a method of manufacturing the laser diode of FIG. 18.
Figure 19B:
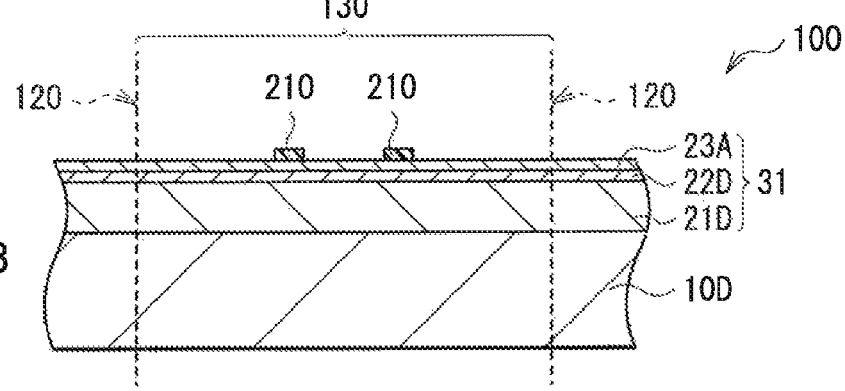

The foregoing second embodiment exemplifies the case that both the groove 26 and the upland section 27 are provided only in the vicinity of the front end face S1 and in the vicinity of the rear end face S2. However, for example, as illustrated in FIG. 18, only the groove 26 may be provided only in the vicinity of one end face (the front end face S1). Such a structure is able to be formed, for example, as follows in the manufacturing process. For example, as illustrated in FIGS. 19A and 19B, first, the insulating layer 210 is formed only on one side of the side region 120A. Next, though not illustrated, after the semiconductor layer 32 is formed on the semiconductor layer 31, the ridge 25 and the upland section 27 are formed by selective etching. The insulating layer 210 is formed only on one side of the side region 120A for the following reason. For example, in the case where the substrate 10D is an inclined substrate (off substrate), in forming the semiconductor layer 32 on the semiconductor layer 31, the thickness of a section around the insulating layer 210 becomes nonuniform in some cases. In light of such nonuniformity, the position of the insulating layer 210 is adjusted. Thus, the center of the insulating layer 210 is not necessarily arranged on the side region 120A. According to needs, the center of the insulating layer 210 may be shifted to one side of the side region 120A as illustrated in FIGS. 19A and 19B.

Figure 20:
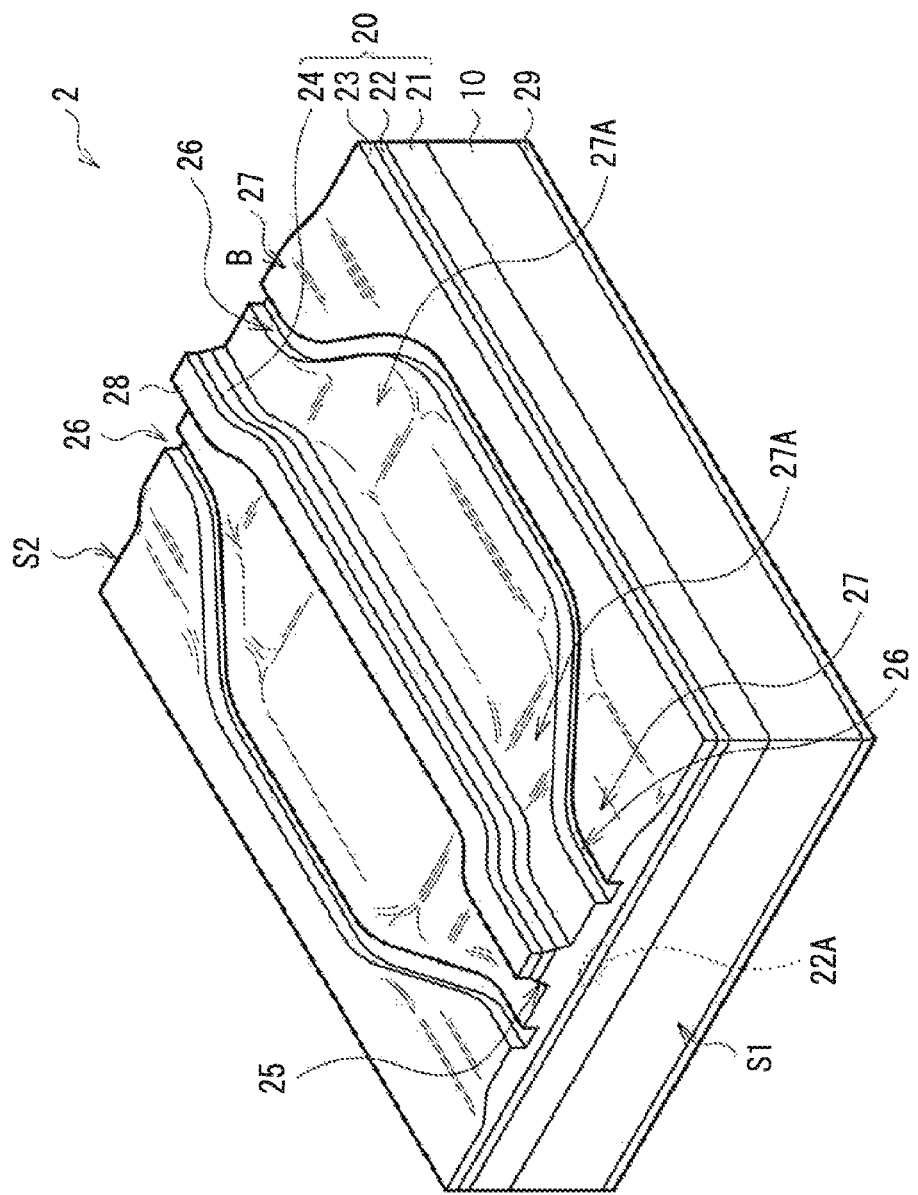
FIG. 20 is a perspective view of another modified example of the laser diode of FIG. 12.

Further, the foregoing embodiment exemplifies the case that both the groove 26 and the upland section 27 are provided only in the vicinity of the front end face S1 and in the vicinity of the rear end face S2. However, both the groove 26 and the upland section 27 may be provided only in the vicinity of one end face (the front end face S1). Otherwise, for example, as illustrated in FIG. 20, it is possible that both the groove 26 and the upland section 27 are provided from the front end face S1 to the rear end face S2. In this case, however, the groove 26 and the upland section 27 are preferably extended in the direction in which a gap with the ridge 25 becomes smaller as the position of the groove 26 and the upland section 27 becomes close to the end section of the ridge 25 (end section in the extending direction) in the vicinity of the front end face S1 and the rear end face S2. Further, the grove section 26 and the upland section 27 are preferably provided in a region apart from the ridge 25 in a section where the groove 26 and the upland section 27 are apart from the front end face S1 and the rear end face S2. That is, in this modified example, the grove section 26 and the upland section 27 are preferably in the shape of an arch projecting toward the opposite side of the ridge 25 in the plane of the top face of the semiconductor layer 20.

While descriptions have been hereinbefore given of the invention with reference to the embodiments, the invention is not limited to the foregoing embodiments, and various modifications may be made.

For example, in the foregoing embodiments, the description has been given of the case that the laser diodes 1 and 2 include only one ridge 25. However, the laser diodes 1 and 2 may include a plurality of ridges 25.

Further, in the foregoing embodiments and the like, the descriptions have been given by taking the gallium nitride laser diode as an example. However, the invention is applicable to, for example, a red laser diode such as a GaInAsP-based compound laser diode and a Group II-VI laser diode such as a ZnCdMgSSeTe. Further, the invention is applicable to a laser diode in which the oscillation wavelength is not limited to the visible range such as an AlGaAs-based laser diode, an InGaAs-based laser diode, an InP-based laser diode, and a GaInAsNP-based laser diode.

The present application contains subject matter related to that disclosed in Japanese Priority Patent Application JP 2009-118900 filed in the Japan Patent Office on May 15, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A laser diode comprising:
    an active layer;
    a stripe-shaped ridge provided above the active layer;
    a pair of resonator end faces sandwiching the active layer and the ridge in an extending direction of the ridge; and
    an upland section in physical contact with both end portions of the ridge in the pair of resonator end faces and in the vicinity thereof, and is apart from the ridge in other regions,
    wherein,
        a thickness from the active layer to a surface of the upland section is larger on the resonator end face side and is smaller on a central side of the ridge, and
        the upland section has an inclined face that is continuously inclined from a thick section of the upland section on at least one resonator end face side to a thin section of the upland section on the central side of the ridge and that does not have a step generated by a selective etching.

2. The laser diode according to claim 1, wherein:
    a groove is provided in the upland section, and
    the groove is extended in a direction in parallel with the extending direction of the ridge, or the groove is extended so that as the groove is close to the resonator end face, a gap between the groove and the ridge becomes small.

3. The laser diode according to claim 2, wherein the groove is extended from in the vicinity of one resonator end face to in the vicinity of the other resonator end face, and is extended so that as the groove is close to the resonator end face, a gap between the groove and the ridge becomes small.

* * * * *